(12) United States Patent
Lee et al.

(10) Patent No.: US 12,376,462 B2
(45) Date of Patent: Jul. 29, 2025

(54) DISPLAY DEVICE

(71) Applicant: SAMSUNG DISPLAY CO., LTD., Yongin-si (KR)

(72) Inventors: Hyeonbum Lee, Yongin-si (KR); Soonil Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/639,156

(22) Filed: Apr. 18, 2024

(65) Prior Publication Data
US 2024/0284725 A1      Aug. 22, 2024

Related U.S. Application Data

(63) Continuation of application No. 17/323,234, filed on May 18, 2021, now Pat. No. 11,991,904.

(30) Foreign Application Priority Data
Nov. 4, 2020 (KR) ................... 10-2020-0146278

(51) Int. Cl.
| | |
|---|---|
| *H10K 59/126* | (2023.01) |
| *H10K 50/84* | (2023.01) |
| *H10K 50/858* | (2023.01) |
| *H10K 59/12* | (2023.01) |
| *H10K 59/122* | (2023.01) |
| *H10K 59/38* | (2023.01) |
| *H10K 59/80* | (2023.01) |

(52) U.S. Cl.
CPC ........... *H10K 59/126* (2023.02); *H10K 50/84* (2023.02); *H10K 50/858* (2023.02); *H10K 59/12* (2023.02); *H10K 59/122* (2023.02); *H10K 59/38* (2023.02); *H10K 59/8722* (2023.02); *H10K 59/879* (2023.02); *H10K 59/8792* (2023.02); *H10K 59/8731* (2023.02)

(58) Field of Classification Search
CPC .. H10K 59/126; H10K 59/122; H10K 59/352; H10K 59/353; H10K 50/84; H10K 50/858; H10K 50/865
See application file for complete search history.

(56) References Cited

U.S. PATENT DOCUMENTS

| | | | |
|---|---|---|---|
| 10,777,621 B2 | 9/2020 | Lee et al. | |
| 11,569,321 B2 | 1/2023 | Lee et al. | |
| 2018/0197922 A1 | 7/2018 | Song | |
| 2019/0013363 A1 | 1/2019 | Joo et al. | |
| 2019/0115411 A1 | 4/2019 | Park et al. | |

(Continued)

FOREIGN PATENT DOCUMENTS

| | | |
|---|---|---|
| KR | 1020180083020 A | 7/2018 |
| KR | 1020190004874 A | 1/2019 |

(Continued)

*Primary Examiner* — Bac H Au
(74) *Attorney, Agent, or Firm* — CANTOR COLBURN LLP

(57) ABSTRACT

A display device includes a substrate including a first display area and a second display area, a first sub-pixel in the first display area, a second sub-pixel in the second display area, and a light-shielding layer having a first hole overlapping the first sub-pixel and a second hole overlapping the second sub-pixel, where a ratio of a width of the first hole to a width of the first sub-pixel is greater than a ratio of a width of the second hole to a width of the second sub-pixel.

19 Claims, 15 Drawing Sheets

(56) References Cited

U.S. PATENT DOCUMENTS

| | | |
|---|---|---|
| 2019/0252470 A1 | 8/2019 | Lee |
| 2020/0006694 A1 | 1/2020 | Lim et al. |
| 2020/0227489 A1 | 7/2020 | Kim et al. |
| 2021/0104708 A1 | 4/2021 | Fukuoka |
| 2021/0134906 A1 | 5/2021 | Lee et al. |
| 2021/0233966 A1 | 7/2021 | Xu et al. |
| 2021/0249486 A1 | 8/2021 | Lee |
| 2022/0013607 A1 | 1/2022 | Lee et al. |
| 2022/0059805 A1 | 2/2022 | Cho et al. |
| 2022/0085327 A1 | 3/2022 | Kim et al. |
| 2022/0181412 A1 | 6/2022 | Kim et al. |
| 2023/0031015 A1 | 2/2023 | Lee et al. |
| 2023/0038366 A1 | 2/2023 | Lee et al. |
| 2023/0068337 A1 | 3/2023 | An et al. |
| 2023/0069748 A1 | 3/2023 | Kim et al. |
| 2023/0209883 A1 | 6/2023 | Ji et al. |
| 2023/0232688 A1 | 7/2023 | Kim |

FOREIGN PATENT DOCUMENTS

| | | |
|---|---|---|
| KR | 1020190045964 A | 5/2019 |
| KR | 1020190048391 A | 5/2019 |
| KR | 1020190095630 A | 8/2019 |
| KR | 1020200001694 A | 1/2020 |

DISPLAY DEVICE

This application is a continuation of U.S. patent application Ser. No. 17/323,234, filed on May 18, 2021, which claims priority to Korean Patent Application No. 10-2020-0146278, filed on Nov. 4, 2020, and all the benefits accruing therefrom under 35 U.S.C. § 119, the content of which in its entirety is herein incorporated by reference.

BACKGROUND

1. Field

One or more embodiments relate to display devices.

2. Description of Related Art

As display devices are becoming thinner and lighter, usage of display devices is being steadily diversified and expanded, and demand for display devices capable of providing high-display quality is increasing.

Display elements included in a display device may emit light and display an image. Light emitted from the display device may proceed in a direction perpendicular to a front surface of the display device or may proceed in a direction oblique to the front surface of the display device.

SUMMARY

When light emitted from a display element travels in a direction oblique to a front surface of the display device, the light emitted from the display element may reach not only a user who uses the display device but also others around the user. Accordingly, information provided by the display device may be shared with others.

One or more embodiments include a display device in which propagation of light emitted from a display element in a direction oblique to a front surface of the display device is reduced.

Additional features will be set forth in part in the description which follows and, in part, will be apparent from the description, or may be learned by practice of the embodiments of the invention.

In an embodiment, a display device includes a substrate including a first display area and a second display area, a first sub-pixel in the first display area, a second sub-pixel in the second display area, and a first light-shielding layer in which a first hole overlapping the first sub-pixel and a second hole overlapping the second sub-pixel are defined, where a ratio of a width of the first hole to a width of the first sub-pixel is greater than a ratio of a width of the second hole to a width of the second sub-pixel.

In an embodiment, the width of the first sub-pixel may be less than the width of the first hole.

In an embodiment, the width of the second sub-pixel may be equal to the width of the second hole.

In an embodiment, a plurality of first display areas and a plurality of second display areas may be provided, the plurality of first display areas and the plurality of second display areas may be arranged in a first direction and a second direction crossing the first direction, respectively, and any one of the plurality of second display areas may be surrounded by the plurality of first display areas.

In an embodiment, a plurality of first sub-pixels may be provided in the first display area, and the first hole may overlap the plurality of first sub-pixels.

In an embodiment, the display device may further include a refractive layer, a high refractive layer, and a second light-shielding layer, where the refractive layer is arranged on the first light-shielding layer and a first refractive layer hole and a second refractive layer hole respectively overlapping the first hole and the second hole are defined in the refractive layer, the high refractive layer is arranged on the refractive layer and filling the first refractive layer hole and the second refractive layer hole, and the second light-shielding layer is arranged on the high refractive layer to overlap the second display area and a third hole overlapping the second hole is defined in the second light-shielding layer, where a refractive index of the high refractive layer is greater than a refractive index of the refractive layer.

In an embodiment, the display device may further include a polarizing layer on the second light-shielding layer.

In an embodiment, the display device may further include a plurality of color filters arranged on the high refractive layer and overlapping the first hole and the second hole, and one of the plurality of color filters may overlap the second hole and fills the third hole.

In an embodiment, the display device may further include a refractive layer, a high refractive layer, and a plurality of color filters, where the refractive layer is arranged on the first light-shielding layer and a first refractive layer hole and a second refractive layer hole respectively overlapping the first hole and the second hole are defined in the refractive layer, the high refractive layer is arranged on the refractive layer and fills the first refractive layer hole and the second refractive layer hole, and the plurality of color filters are arranged on the high refractive layer and overlap the first hole and the second hole, where a refractive index of the high refractive layer is greater than a refractive index of the refractive layer, the plurality of color filters includes a first color filter, a second color filter, and a third color filter for transmitting light of different colors from one another, and the first color filter, the second color filter, and the third color filter overlap each other on the first light-shielding layer and define a light-shielding portion.

In an embodiment, the display device may further include a first display element implementing the first sub-pixel, a second display element implementing the second sub-pixel, and an encapsulation layer arranged on the first and second display elements and including at least one inorganic encapsulation layer and at least one organic encapsulation layer, where the first light-shielding layer may be arranged on the at least one inorganic encapsulation layer.

In another embodiment, a display device includes a substrate including a first display area and a second display area, a display element layer including a first display element, a second display element, and a pixel-defining layer, where the first display element includes a first electrode overlapping the first display area, the second display element includes a second electrode overlapping the second display area, and the pixel-defining layer covers an edge of the first electrode and an edge of the second electrode, and a first opening exposing a central portion of the first electrode and a second opening exposing a central portion of the second electrode are defined in the pixel-defining layer, and a first light-shielding layer which is arranged on the display element layer and in which a first hole overlapping the first opening and a second hole overlapping the second opening are defined, where a ratio of a width of the first hole to a width of the first opening is greater than a ratio of a width of the second hole to a width of the second opening.

In an embodiment, the width of the first opening may be less than the width of the first hole.

In an embodiment, the width of the second opening may be equal to the width of the second hole.

In an embodiment, the display device may further include a refractive layer, a high refractive layer, and a second light-shielding layer, where the refractive layer is arranged on the first light-shielding layer and a first refractive layer hole and a second refractive layer hole respectively overlapping the first hole and the second hole are defined in the refractive layer, the high refractive layer is arranged on the refractive layer and filling the first refractive layer hole and the second refractive layer hole, and the second light-shielding layer is arranged on the high refractive layer to overlap the second display area and a third hole overlapping the second hole is defined, where a refractive index of the high refractive layer is greater than a refractive index of the refractive layer.

In an embodiment, the display device may further include a polarizing layer on the second light-shielding layer.

In an embodiment, the display device may further include a plurality of color filters arranged on the high refractive layer and overlapping the first hole and the second hole, where one of the plurality of color filters may overlap the second hole and fills the third hole.

In an embodiment, the display device may further include a refractive layer, a high refractive layer, and a plurality of color filters, where the refractive layer is arranged on the first light-shielding layer and a first refractive layer hole and a second refractive layer hole respectively overlapping the first hole and the second hole are defined in the refractive layer, the high refractive layer is arranged on the refractive layer and fills the first refractive layer hole and the second refractive layer hole, and the plurality of color filters is arranged on the high refractive layer and overlap the first hole and the second hole, where a refractive index of the high refractive layer is greater than a refractive index of the refractive layer, the plurality of color filters includes a first color filter, a second color filter, and a third color filter for transmitting light of different colors from one another, and the first color filter, the second color filter, and the third color filter overlap each other on the first light-shielding layer and define a light-shielding portion.

In an embodiment, a vertical distance from a surface of the second electrode facing the second light-shielding layer to a surface of the second light-shielding layer facing the second electrode may be about 30 micrometers (μm) or more.

In an embodiment, the display device may further include an inorganic layer between the high refractive layer and the second light-shielding layer.

In an embodiment, the display device may further include an encapsulation layer arranged on the display element layer, where the encapsulation layer includes a first inorganic encapsulation layer, a first organic encapsulation layer, a second inorganic encapsulation layer, a third inorganic encapsulation layer, a second organic encapsulation layer, and a fourth inorganic encapsulation layer that are sequentially stacked, and a second light-shielding layer which is arranged on the encapsulation layer to overlap the second display area and in which a third hole overlapping the second hole is defined, where the first light-shielding layer is arranged between the second inorganic encapsulation layer and the third inorganic encapsulation layer, and a width of the third hole is greater than the width of the second hole.

BRIEF DESCRIPTION OF THE DRAWINGS

The above and other embodiments, features, and advantages of embodiments of the invention will be more apparent from the following description taken in conjunction with the accompanying drawings, in which.

DETAILED DESCRIPTION

Figure 1:
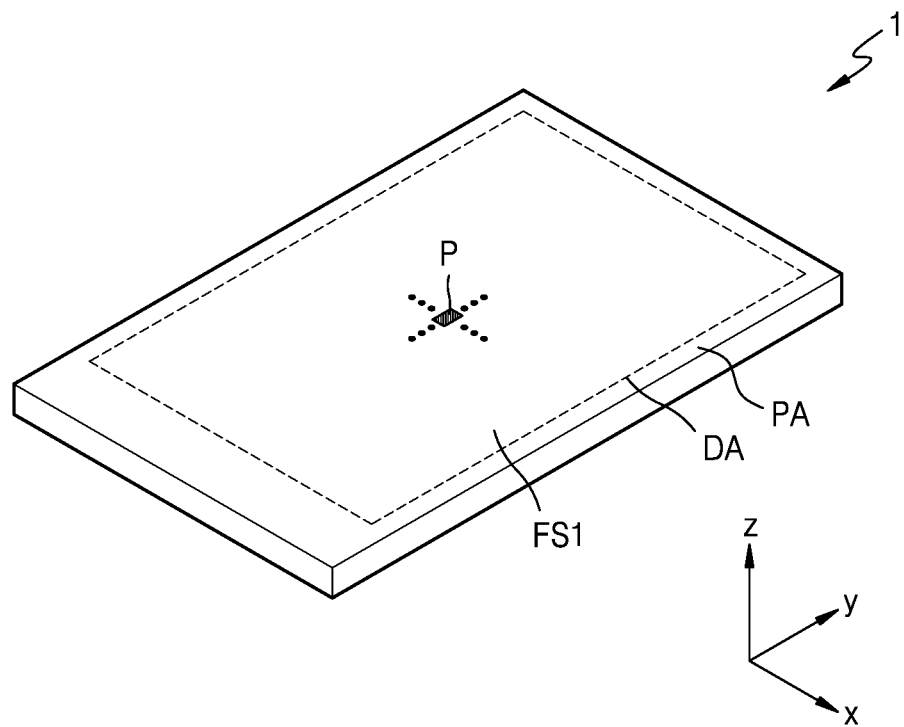
FIG. 1 is a perspective view schematically illustrating an embodiment of a display device.

Reference will now be made in detail to embodiments, examples of which are illustrated in the accompanying drawings, wherein like reference numerals refer to like elements throughout the disclosure. In this regard, the embodiments may have different forms and configurations and should not be construed as being limited to the descriptions set forth herein. Accordingly, the embodiments are merely described below, by referring to the drawing figures, to explain features of the disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any variations thereof.

Because the disclosure may have diverse modified embodiments, embodiments are illustrated in the drawings and are described with respect to the embodiments. An effect and a characteristic of the disclosure, and a method of accomplishing them will be apparent by referring to embodiments described with reference to the drawings. The disclosure may, however, be embodied in many different forms and configurations and should not be construed as limited to the embodiments set forth herein.

One or more embodiments of the disclosure will be described below in more detail with reference to the accompanying drawings. Components that are the same or are in correspondence with each other are rendered the same reference numeral regardless of the figure number, and redundant explanations are omitted.

While such terms as "first," "second," etc., may be used to describe various components, such components are not to be limited to the above terms. The above terms are used only to distinguish one component from another component.

An expression used in the singular encompasses an expression of the plural unless the context expressly indicates otherwise.

It will be understood that the terms "comprises" and/or "comprising" used herein specify the presence of stated features or elements, but do not preclude the presence or addition of one or more other features or elements.

It will be further understood that when a layer, region, or element is referred to as being "formed on" another layer, area, or element, it can be directly or indirectly formed on the other layer, region, or element. That is, for example, one or more intervening layers, regions, or elements may be present therebetween.

Sizes of elements in the drawings may be exaggerated or contracted for convenience of explanation. In other words, because sizes and thicknesses of elements in the drawings are arbitrarily illustrated for convenience of explanation, the following embodiments are not limited thereto.

When an embodiment may be implemented differently, a process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, when layers, areas, or elements or the like are referred to as being "electrically connected," they may be directly electrically connected, or layers, areas or elements may be indirectly electrically connected, and an intervening layer, region, component, or the like may be present therebetween.

A display device displays an image and may be a portable mobile device such as game consoles, multimedia devices, or micro personal computers ("PCs"). For example, display devices to be described below include liquid crystal display devices, electrophoretic display devices, organic light-emitting displays, inorganic light-emitting displays, field emission displays, surface-conduction electrode-emitter displays, quantum dot displays, plasma displays, cathode ray displays, or the like. Hereinafter, an organic light-emitting display device will be described as an example of a display device according to an embodiment, but embodiments of the invention may be various other types of display devices as described above.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a perspective view schematically illustrating an embodiment of a display device 1.

Referring to FIG. 1, the display device 1 may include a display area DA and a peripheral area PA. A sub-pixel P may be arranged in the display area DA. In an embodiment, the sub-pixel P may be arranged on a front surface FS1 of the display device 1.

In an embodiment, a plurality of sub-pixels P may be arranged in the display area DA. The sub-pixels P may be implemented as a display element. The display device 1 may provide an image using light emitted from the sub-pixels P. In an embodiment, the light emitted from the sub-pixel P may travel in a direction perpendicular to the front surface FS1 of the display device 1 (e.g., a z direction) and/or in a direction substantially perpendicular to the front surface FS1 of the display device 1. In an embodiment, the light emitted from the sub-pixel P may travel in a direction oblique to the front surface FS1 of the display device 1 (e.g., a direction crossing the z direction).

In an embodiment, the sub-pixel P may emit one of red light, green light, and blue light through the display element. In an embodiment, the sub-pixel P may emit one of red light, green light, blue light, and white light through the display element. In an embodiment, the sub-pixel P may be defined as a light-emitting area of a display element that emits one of red light, green light, blue light, and white light.

The sub-pixel P may include a light-emitting diode as a display element capable of emitting light of a color. The light-emitting diode may include an organic light-emitting diode including an organic material, as an emission layer. In some embodiments, the light-emitting diode may include an inorganic light-emitting diode. In some embodiments, the light-emitting diode may include quantum dots as an emission layer. In an embodiment, a size of the light-emitting diode may be a microscale or a nanoscale. In an embodiment, the light-emitting diode may include a micro light-emitting diode, for example. In some embodiments, the light-emitting diode may be a nano light-emitting diode. In an embodiment, the nano light-emitting diode may include gallium nitride (GaN), for example. In an embodiment, a color conversion layer may be arranged on the nano light-emitting diode. The color conversion layer may include quantum dots. For convenience of description, a case where the light-emitting diode includes an organic light-emitting diode will now be focused on and described in detail.

The peripheral area PA may be an area that does not provide an image. The peripheral area PA may at least partially surround the display area DA. In an embodiment, the peripheral area PA may entirely surround the display area DA. A driver or the like for providing an electrical signal or power to the sub-pixel P may be arranged in the peripheral area PA. In addition, the peripheral area PA may include a pad area in which a pad is arranged.

Figure 2A:
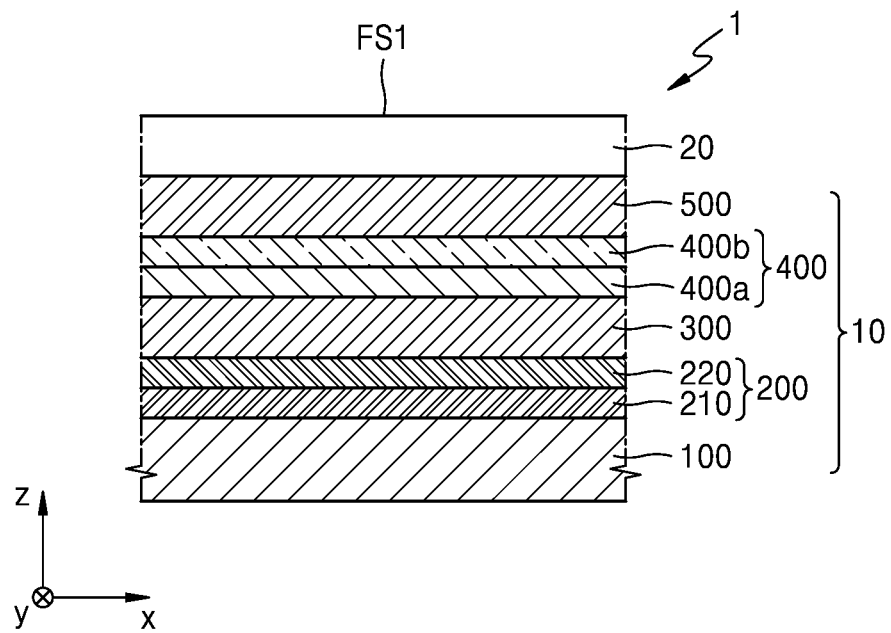
FIGS. 2A and 2B are cross-sectional views schematically illustrating an embodiment of a display device.
Figure 2B:
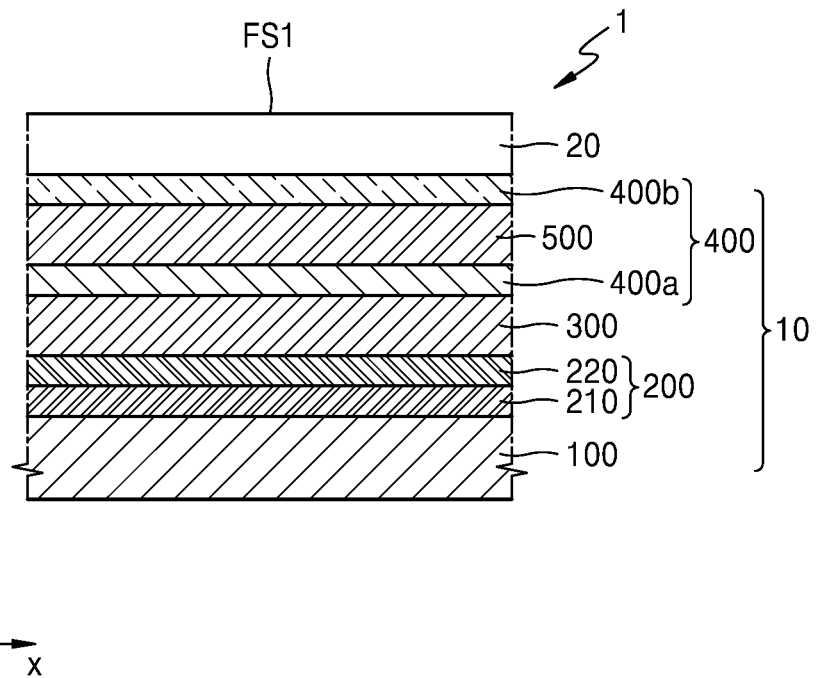

FIGS. 2A and 2B are cross-sectional views schematically illustrating a display device 1 according to one or more embodiments.

Referring to FIG. 2A, the display device 1 may include a display panel 10 and a cover window 20. The display panel 10 may include a substrate 100, a display layer 200, an encapsulation layer 300, a functional layer 400, and an anti-reflection layer 500.

In an embodiment, the substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. In an embodiment, the substrate 100 may have a multi-layered structure including a base layer including the polymer resin described above and a barrier layer (not shown). The substrate 100 including the polymer resin may be flexible, rollable, or bendable.

The display layer 200 may be arranged on the substrate 100. The display layer 200 may include a pixel circuit layer 210 and a display element layer 220. The pixel circuit layer 210 may include a plurality of pixel circuits. The display element layer 220 may include a plurality of display elements respectively connected to the plurality of pixel circuits. Each of the display elements included in the display element layer 220 may define a pixel. The pixel circuit layer 210 may include a plurality of thin-film transistors and a plurality of storage capacitors.

The encapsulation layer 300 may be arranged on the display layer 200. In an embodiment, the encapsulation layer 300 may include at least one inorganic encapsulation layer and at least one organic encapsulation layer. In an embodiment, the at least one inorganic encapsulation layer may include at least one inorganic material from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include acryl-based resins, epoxy-based resins, polyimide, polyethylene, and the like. In an embodiment, the at least one organic encapsulation layer may include acrylate.

In another embodiment, the encapsulation layer 300 may have a structure in which the substrate 100 and an upper substrate that is a transparent member are coupled to each other with a sealing member so as to seal an inner space between the substrate 100 and the upper substrate. At this time, an absorbent, a filler, or the like may be disposed in the inner space. In an embodiment, the sealing member may be a sealant, and in another embodiment, the sealing member may include a material that is cured by intense light (e.g., laser). In an embodiment, the sealing member may include a frit. In an embodiment, the sealing member may include an organic sealant, such as urethane-based resins, epoxy-based resins, or acryl-based resins, or an inorganic sealant, such as silicone. In an embodiment, the urethane-based resins include urethane acrylate or the like, for example. In an embodiment, the acryl-based resins include butyl acrylate, ethyl hexyl acrylate, or the like, for example. Moreover, the sealing member may include a material that is cured by heat.

The functional layer 400 may be arranged on the encapsulation layer 300. The functional layer 400 may include a first layer 400a and a second layer 400b. In an embodiment, at least one of the first layer 400a and the second layer 400b may include a touch sensor layer. The touch sensor layer is a layer that senses a user's touch input, and may sense the user's touch input using at least one of various touch methods such as a resistive film method and a capacitive method. In an embodiment, at least one of the first layer 400a and the second layer 400b may include an optical layer. In an embodiment, the optical layer may have a structure for controlling a direction of light emitted from display elements. In an embodiment, the optical layer may have a structure for extracting light emitted from the display elements to a front surface FS1 of the display device. In an embodiment, the optical layer may include a light-shielding layer.

In an embodiment, the functional layer 400 may be provided so that some elements of the touch sensor layer and some elements of the optical layer are shared with each other. In other words, the functional layer 400 may be a touch sensor layer capable of sensing a touch input and an optical layer capable of improving optical performance. The functional layer 400 may include sensing electrodes to sense a touch input, and may include a light-shielding layer to control a direction of light emitted from the display elements.

The anti-reflection layer 500 may be arranged on the functional layer 400. The anti-reflection layer 500 may reduce the reflectance of light (external light) incident from the outside toward the display panel 10.

In an embodiment, the anti-reflection layer 500 may include a polarization film. In an embodiment, the polarization film may include a linear planarization plate and a phase delay film such as a quarter-wave ($\lambda/4$) plate. The phase delay film may be arranged on the functional layer 400, and the linear planarization plate may be arranged on the phase delay film.

In an embodiment, the anti-reflection layer 500 may include a light-shielding layer and/or a filter layer including color filters. The color filters may be arranged by considering a color of light emitted from each of the sub-pixels of the display panel 10. In an embodiment, the filter layer may include one of a red color filter, a green color filter, and a blue color filter, for example.

In an embodiment, when the anti-reflection layer 500 includes a light-shielding layer and/or color filters, the anti-reflection layer 500 may be arranged between the first layer 400a and the second layer 400b as shown in FIG. 2B. In this case, elements of the anti-reflection layer 500 and elements of the optical layer may be at least partially shared with each other.

The cover window 20 may be arranged on the display panel 10. In an embodiment, the cover window 20 may be coupled to an element therebelow, for example, at least one of the anti-reflection layer 500 and the functional layer 400 through adhesion using, for example, an optically clear adhesive ("OCA"). The cover window 20 may protect the display panel 10. In an embodiment, the cover window 20 may include at least one of glass, sapphire, and plastic. In an embodiment, the cover window 20 may be ultra-thin glass ("UTG") or colorless polyimide ("CPI"), for example.

Figure 3:
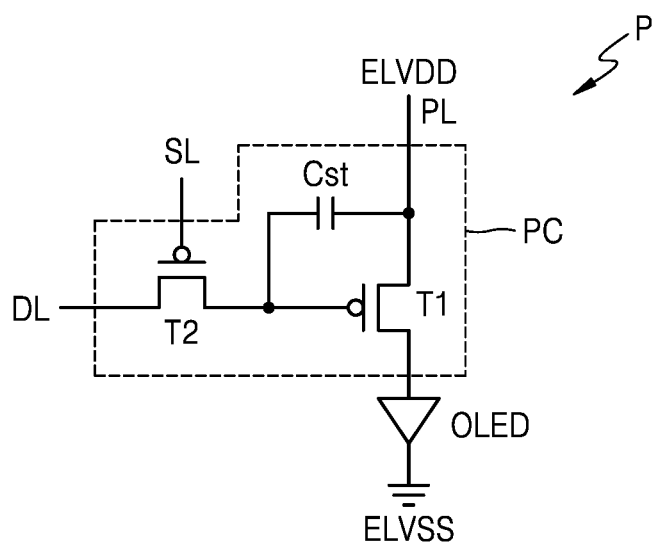
FIG. 3 is an equivalent circuit diagram schematically illustrating an embodiment of a sub-pixel.

FIG. 3 is an equivalent circuit diagram schematically illustrating an embodiment of a sub-pixel P.

Referring to FIG. 3, the sub-pixel P may include a pixel circuit PC and an organic light-emitting diode OLED as a display element.

The pixel circuit PC may include a driving thin-film transistor T1, a switching thin-film transistor T2, and a storage capacitor Cst. In an embodiment, each of the sub-pixels P may emit, from the organic light-emitting diode OLED, one of red light, green light, and blue light or one of red light, green light, blue light, and white light, for example.

The switching thin-film transistor T2 may be connected to a scan line SL and a data line DL and may transmit a data signal or a data voltage received via the data line DL to the driving thin-film transistor T1 according to a scan signal or a switching voltage received via the scan line SL. The storage capacitor Cst may be connected to the switching thin-film transistor T2 and a driving voltage line PL and may store a voltage difference between a voltage received from the switching thin-film transistor T2 and a first power voltage ELVDD applied to the driving voltage line PL.

The driving thin-film transistor T1 may be connected to the driving voltage line PL and the storage capacitor Cst and may control a driving current flowing to the organic light-emitting diode OLED from the driving voltage line PL corresponding to the voltage stored in the storage capacitor Cst. The organic light-emitting diode OLED may emit light having a luminance according to the driving current. A common electrode (e.g., a cathode) of the organic light-emitting diode OLED may receive a second power supply voltage ELVSS.

Figure 4:
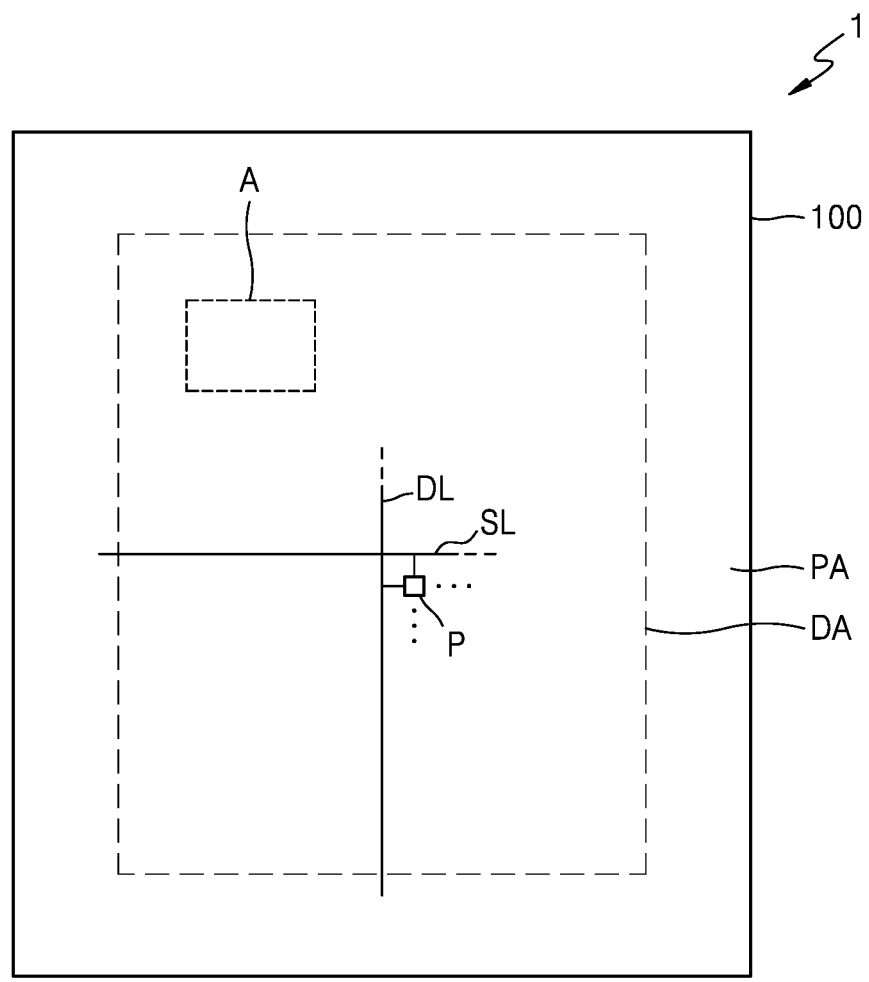
FIG. 4 is a plan view schematically illustrating an embodiment of a display device.
Figure 4:
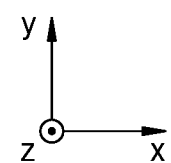

FIG. 4 is a plan view schematically illustrating an embodiment of a display device 1.

Referring to FIG. 4, the display device 1 may include a substrate 100 and a multi-layer film on the substrate 100. A display area DA and a peripheral area PA may be defined on the substrate 100 and/or the multi-layer film. In an embodiment, the substrate 100 may include the display area DA and the peripheral area PA, for example. Hereinafter, a detailed description will be given focusing on the case where the display area DA and the peripheral area PA are defined on the substrate 100.

A sub-pixel P may be arranged in the display area DA, and a plurality of sub-pixels P may display an image. Each of the sub-pixels P may be connected to a scan line SL extending in a first direction (e.g., an x direction or a −x direction) and a data line DL extending in a second direction (e.g., a y direction or a −y direction).

The peripheral area PA may be arranged outside the display area DA. The peripheral area PA may at least partially surround the display area DA. In an embodiment, the peripheral area PA may entirely surround the display area DA. A scan driver (not shown) for providing a scan signal to each of the sub-pixels P may be arranged in the peripheral area PA. A data driver (not shown) for providing a data signal to the sub-pixels P may be arranged in the peripheral area PA. The peripheral area PA may include a pad area (not shown). In an embodiment, a pad (not shown) may be arranged in the pad area. The pad may be exposed without being covered by an insulating layer and may be electrically connected to a printed circuit board or a driver integrated circuit ("IC"). Signals and/or voltages received from the printed circuit board or the driver IC through the pad may be transmitted to the sub-pixel P arranged in the display area DA through a wiring (not shown) connected to the pad.

Figure 5A:
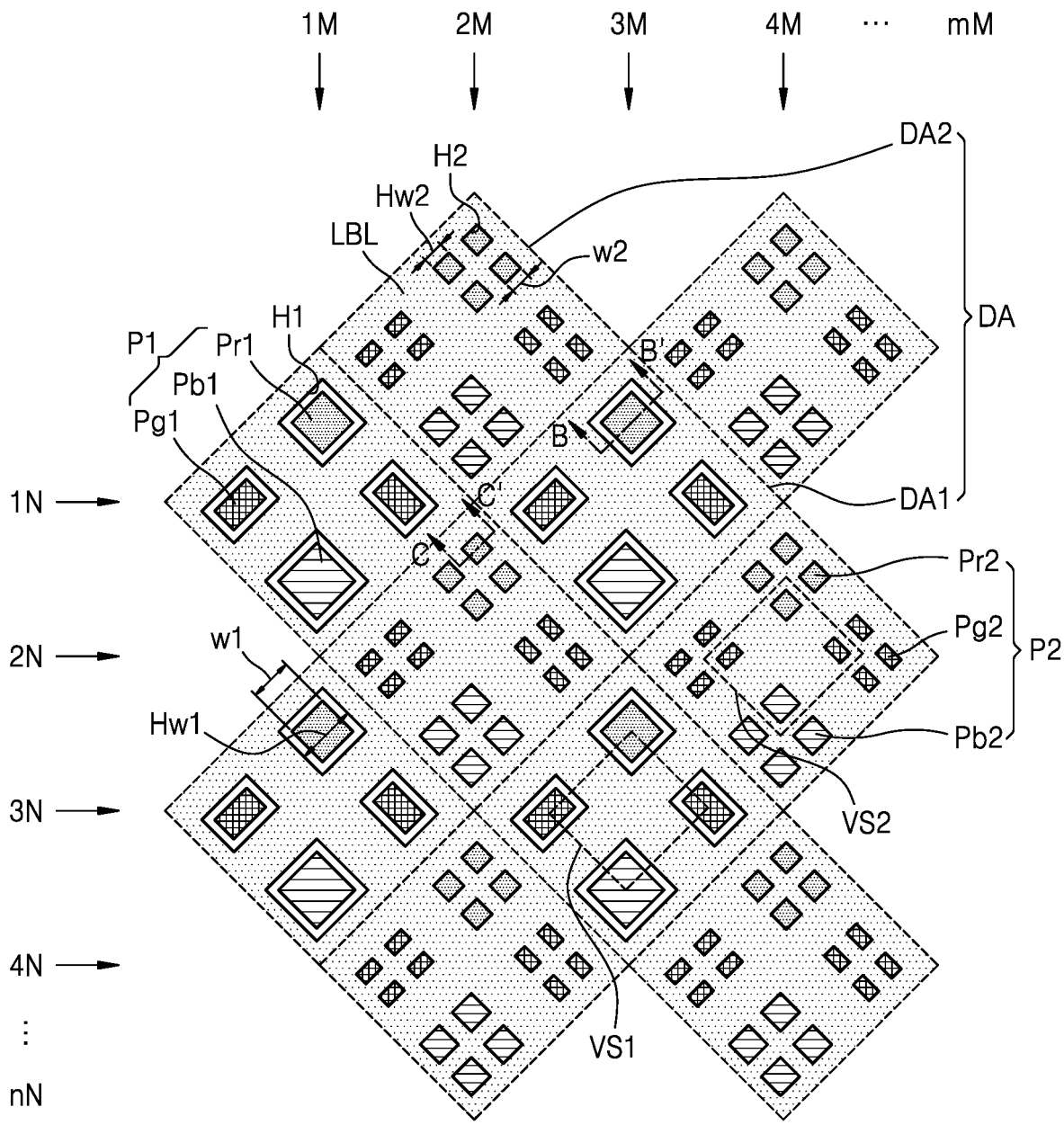
FIG. 5A is an enlarged view of an embodiment of a display area of a display device.

FIG. 5A is an enlarged view of an embodiment of a display area DA of a display device. FIG. 5A is an enlarged view of a region A of the display device 1 in FIG. 4.

Referring to FIG. 5A, the display area DA may include a first display area DA1 and a second display area DA2. In an embodiment, a plurality of first display areas DA1 and a plurality of second display areas DA2 may be provided. In an embodiment, the plurality of first display areas DA1 and the plurality of second display areas DA2 may be arranged in a first direction and a second direction crossing the first direction. In an embodiment, the first direction and the second direction may be orthogonal to each other. In an embodiment, the first direction may be an x direction or a −x direction, for example. The second direction may be a y direction or a −y direction. In another embodiment, the first direction and the second direction may define an acute angle or an obtuse angle. Hereinafter, a case where the first direction (e.g., the x direction or −x direction) and the second direction (e.g., the y direction or −y direction) are orthogonal to each other will be mainly described in detail.

Among n rows 1N to nN (n is a natural number), in a first row 1N, the plurality of first display areas DA1 may be arranged in the first direction (e.g., the x direction or the −x direction). In a second row 2N adjacent to the first row 1N, the plurality of second display areas DA2 may be arranged in the first direction (e.g., the x direction or the −x direction). In a third row 3N adjacent to the second row 2N, the plurality of first display areas DA1 may be arranged in the first direction (e.g., the x direction or the −x direction). In a fourth row 4N adjacent to the third row 3N, the plurality of second display areas DA2 may be arranged in the first direction (e.g., the x direction or the −x direction).

The plurality of first display areas DA1 arranged in the first row 1N and the plurality of second display areas DA2 arranged in the second row 2N may be alternately arranged. Thus, among m columns 1M to mM (m is a natural number), in a first column 1M, the plurality of first display areas DA1 may be arranged in the second direction (e.g., the y direction or the −y direction). In a second column 2M adjacent to the first column 1M, the plurality of second display areas DA2 may be arranged in the second direction (e.g., the y direction or the −y direction). In a third column 3M adjacent to the second column 2M, the plurality of first display areas DA1 may be arranged in the second direction (e.g., the y direction or the −y direction). In a fourth column 4M adjacent to the third column 3M, the plurality of second display areas DA2 may be arranged in the second direction (e.g., the y direction or the −y direction).

The plurality of first display areas DA1 and the plurality of second display areas DA2 may be alternately arranged in an extension direction EDR crossing the first direction (e.g., the x direction or the −x direction) and the second direction (e.g., the y direction or the −y direction). The plurality of first display areas DA1 and the plurality of second display areas DA2 may be alternately arranged in a crossing direction CDR crossing the extension direction EDR. In an embodiment, the extension direction EDR and the crossing direction CDR may be orthogonal to each other. In another embodiment, the extension direction EDR and the crossing direction CDR may define an acute angle or an obtuse angle. Hereinafter, a detailed description will be given focusing on the case where the extension direction EDR and the crossing direction CDR are orthogonal to each other.

In a different way of expressing the arrangement structure of the display area DA, any one of the plurality of second display areas DA2 may be surrounded by the plurality of first display areas DA1. Any one of the plurality of first display areas DA1 may be surrounded by the plurality of second display areas DA2.

A first sub-pixel P1 may be arranged in the first display area DA1. The first sub-pixel P1 may overlap the first display area DA1. In an embodiment, the first sub-pixel P1 may include a first red sub-pixel Pr1, a first green sub-pixel Pg1, and a first blue sub-pixel Pb1. In another embodiment, the first sub-pixel P1 may include a first red sub-pixel Pr1, a first green sub-pixel Pg1, a first blue sub-pixel Pb1, and a first white sub-pixel (not shown). Hereinafter, the case where the first sub-pixel P1 includes a first red sub-pixel Pr1, a first green sub-pixel Pg1, and a first blue sub-pixel Pb1 will be mainly described in detail.

In an embodiment, the first red sub-pixel Pr1, the first green sub-pixel Pg1, and the first blue sub-pixel Pb1 may be arranged at vertices of a first virtual quadrilateral VS1. In an embodiment, the first red sub-pixel Pr1 and the first blue sub-pixel Pb1 may be respectively arranged at first and third vertices facing each other, and the first green sub-pixels Pg1 may be respectively arranged at second and fourth vertices, which are the remaining vertices, for example.

In an embodiment, the first green sub-pixel Pg1 may have a quadrangular (e.g., rectangular) shape having a long side and a short side. The first green sub-pixel Pg1 may be defined as a light-emitting area emitting green light in the first display area DA1. The short side of the first green sub-pixel Pg1 may face the first red sub-pixel Pr1. The long side of the first green sub-pixel Pg1 may face the first blue sub-pixel Pb1. In an embodiment, the long side of the first green sub-pixel Pg1 may extend in the extension direction EDR. The short side of the first green sub-pixel Pg1 may extend in the crossing direction CDR.

In an embodiment, at least one of the first red sub-pixel Pr1 and the first blue sub-pixel Pb1 may have a square shape. The first red sub-pixel Pr1 may be defined as a light-emitting area emitting red light in the first display area DA1. The first blue sub-pixel Pb1 may be defined as a light-emitting area emitting blue light in the first display area DA1. In another embodiment, at least one of the first red sub-pixel Pr1 and the first blue sub-pixel Pb1 may have a quadrangular (e.g., rectangular) shape. In an embodiment, a side of the first red sub-pixel Pr1 may extend in the extension direction EDR or the crossing direction CDR. In an embodiment, a side of the first blue sub-pixel Pb1 may extend in the extension direction EDR or the crossing direction CDR.

A second sub-pixel P2 may be arranged in the second display area DA2. The second sub-pixel P2 may overlap the second display area DA2. In an embodiment, the second sub-pixel P2 may include a second red sub-pixel Pr2, a second green sub-pixel Pg2, and a second blue sub-pixel Pb2. In another embodiment, the second sub-pixel P2 may include the second red sub-pixel Pr2, the second green sub-pixel Pg2, the second blue sub-pixel Pb2, and a second white sub-pixel (not shown). Hereinafter, a case where the second sub-pixel P2 includes the second red sub-pixel Pr2, the second green sub-pixel Pg2, and the second blue sub-pixel Pb2 will be mainly described in detail.

In an embodiment, a plurality of second red sub-pixels Pr2, a plurality of second green sub-pixels Pg2, and a plurality of second blue sub-pixels Pb2 may be provided in the second display area DA2. In an embodiment, four second red sub-pixels Pr2 may be arranged in a single second display area DA2, for example. Eight second green sub-pixels Pg2 may be arranged in a single second display area DA2. Four second blue sub-pixels Pb2 may be arranged in a single second display area DA2.

In an embodiment, a second virtual quadrilateral VS2 may be defined in the second display area DA2. The second virtual quadrilateral VS2 may have a first vertex, a second vertex, a third vertex, and a fourth vertex. In an embodiment, the plurality of second red sub-pixels Pr2 may be symmetrically arranged with respect to the first vertex. The four second red sub-pixels Pr2 may be symmetrically arranged with respect to the first vertex. The plurality of second blue sub-pixels Pb2 may be symmetrically arranged with respect to the third vertex facing the first vertex. In an embodiment, the plurality of second blue sub-pixels Pb2 may be symmetrically arranged with respect to the third vertex, for example. The plurality of second green sub-pixels Pg2 may be symmetrically arranged with respect to the second vertex and the fourth vertex facing each other. In an embodiment, four second green sub-pixels Pg2 may be symmetrically arranged with respect to the second vertex, for example. The four second green sub-pixels Pg2 may be symmetrically arranged with respect to the fourth vertex.

In an embodiment, the second green sub-pixel Pg2 may have a quadrangular (e.g., rectangular) shape having a long side and a short side. The second green sub-pixel Pg2 may be defined as a light-emitting area emitting green light in the second display area DA2. The short side of the second green sub-pixel Pg2 may face the second red sub-pixel Pr2. The long side of the second green sub-pixel Pg2 may face the second blue sub-pixel Pb2. In an embodiment, the long side of the second green sub-pixel Pg2 may extend in the extension direction EDR. The short side of the second green sub-pixel Pg2 may extend in the crossing direction CDR.

In an embodiment, at least one of the second red sub-pixel Pr2 and the second blue sub-pixel Pb2 may have a square shape. The second red sub-pixel Pr2 may be defined as a light-emitting area emitting red light in the second display area DA2. The second blue sub-pixel Pb2 may be defined as an emission area emitting blue light in the second display area DA2. In another embodiment, at least one of the second red sub-pixel Pr2 and the second blue sub-pixel Pb2 may have a quadrangular (e.g., rectangular) shape. In an embodiment, a side of the second red sub-pixel Pr2 may extend in the extension direction EDR or the crossing direction CDR. In an embodiment, a side of the second blue sub-pixel Pb2 may extend in the extension direction EDR or the crossing direction CDR.

A size of the first sub-pixel P1 may be greater than a size of the second sub-pixel P2. The size of the first sub-pixel P1 may be defined as an area of the first sub-pixel P1. The size of the second sub-pixel P2 may be defined as an area of the second sub-pixel P2. In an embodiment, a size of the first red sub-pixel Pr1 may be greater than a size of the second red sub-pixel Pr2, for example. A size of the first green sub-pixel Pg1 may be greater than a size of the second green sub-pixel Pg2. A size of the first blue sub-pixel Pb1 may be greater than a size of the first blue sub-pixel Pb1.

A width w1 of the first sub-pixel P1 may be greater than a width w2 of the second sub-pixel P2. In an embodiment, the width w1 of the first sub-pixel P1 may be a length of the first sub-pixel P1 in the first direction (e.g., the x direction or the −x direction). In an embodiment, the width w1 of the first sub-pixel P1 may be a length of the first sub-pixel P1 in the second direction (e.g., the y direction or the −y direction). In another embodiment, the width w1 of the first sub-pixel P1 may be a length of the first sub-pixel P1 in the extension direction EDR. In another embodiment, the width w1 of the first sub-pixel P1 may be a length of the first sub-pixel P1 in the crossing direction CDR. Hereinafter, for convenience of explanation, a case where the width w1 of the first sub-pixel P1 is defined as the length of the first sub-pixel P1 in the extension direction EDR will be mainly described in detail. Similarly, the width w2 of the second sub-pixel P2 may be defined as the length of the second sub-pixel P2 in the extension direction EDR.

In an embodiment, a width of the first red sub-pixel Pr1 may be greater than a width of the second red sub-pixel Pr2. A width of the first green sub-pixel Pg1 may be greater than a width of the second green sub-pixel Pg2. A width of the first blue sub-pixel Pb1 may be greater than a width of the second blue sub-pixel Pb2.

A light-shielding layer LBL may at least partially absorb external light or internal reflected light. The light-shielding layer LBL may include a black pigment. The light-shielding layer LBL may include a black matrix. The light-shielding layer LBL may be arranged in the display area DA. The light-shielding layer LBL may be arranged in the first display area DA1 and the second display area DA2. The light-shielding layer LBL may overlap the first display area DA1 and the second display area DA2.

A first hole H1 and a second hole H2 may be defined in the light-shielding layer LBL. The first hole H1 and the second hole H2 may penetrate through the light-shielding layer LBL. The first hole H1 may overlap the first display area DA1. A plurality of first holes H1 may be provided. The first holes H1 may overlap the first sub-pixel P1. In an embodiment, the plurality of first holes H1 may overlap the first red sub-pixel Pr1, the first green sub-pixel Pg1, and the first blue sub-pixel Pb1, respectively, for example.

The second hole H2 may overlap the second display area DA2. A plurality of second holes H2 may be provided. The second holes H2 may overlap the second sub-pixel P2. In an embodiment, the plurality of second holes H2 may overlap the second red sub-pixels Pr2, respectively, for example.

A size of the first hole H1 may be greater than a size of the second hole H2. The size of the first hole H1 may be defined as an area occupied by the first hole H1. The size of second hole H2 may be defined as an area occupied by second hole H2. In an embodiment, a size of the first hole H1 overlapping the first red sub-pixel Pr1 may be greater than a size of the second hole H2 overlapping the second red sub-pixel Pr2, for example.

A width Hw1 of the first hole H1 may be greater than a width Hw2 of the second hole H2. In an embodiment, the width Hw1 of the first hole H1 may be a length of the first hole H1 in the first direction (e.g., the x direction or the −x direction). In another embodiment, the width Hw1 of the first hole H1 may be a length of the first hole H1 in the second direction (e.g., the y direction or the −y direction). In another embodiment, the width Hw1 of the first hole H1 may be a length of the first hole H1 in the extension direction EDR. In another embodiment, the width Hw1 of the first hole H1 may be a length of the first hole H1 in the crossing direction CDR. Hereinafter, for convenience of explanation, a case where the width Hw1 of the first hole H1 is defined as a length of the first hole H1 in the extension direction EDR will be mainly described in detail. Similarly, the width Hw2 of the second hole H2 may be defined as a length of the second hole H2 in the extension direction EDR.

A ratio of a size of the first hole H1 to a size of the first sub-pixel P1 may be greater than a ratio of a size of the second hole H2 to a size of the second sub-pixel P2. When the size of the first sub-pixel P1 is X and the size of the first hole H1 is Y, a ratio of the size of the first hole H1 to the size of the first sub-pixel P1 may be Y/X. When the size of the second sub-pixel P2 is Z and the size of the second hole H2 is W, a ratio of the size of the second hole H2 to the size of the second sub-pixel P2 may be W/Z.

A ratio of the width Hw1 of the first hole H1 to the width w1 of the first sub-pixel P1 may be greater than a ratio of the width Hw2 of the second hole H2 to the width w2 of the second sub-pixel P2. When the width w1 of the first sub-pixel P1 is X and the width Hw1 of the first hole H1 is Y, a ratio of the width Hw1 of the first hole H1 to the width w1 of the first sub-pixel P1 may be Y/X. When the width w2 of the second sub-pixel P2 is Z and the width Hw2 of the second hole H2 is W, a ratio of the width Hw2 of the second hole H2 to the width w2 of the second sub-pixel P2 may be W/Z.

The size of the first sub-pixel P1 may be less than the size of the first hole H1. In an embodiment, the first sub-pixel P1 may be arranged inside the first hole H1. In an embodiment, the first red sub-pixel Pr1 may be arranged inside the first hole H1, for example. In this case, the size of the first hole H1 may be greater than a light-emitting area emitting red light, for example. In an embodiment, the width w1 of the first sub-pixel P1 may be less than the width Hw1 of the first hole H1. In an embodiment, the width of the first red sub-pixel Pr1 may be less than the width Hw1 of the first hole H1, for example.

Light emitted from the first sub-pixel P1 may be emitted in a third direction (e.g., a z direction or a −z direction) that is perpendicular to the first direction (e.g., the x direction or the −x direction) and the second direction (e.g., the y direction or the −y direction). In addition, light emitted from the first sub-pixel P1 may be emitted in a direction oblique to the third direction (e.g., the z direction or the −z direction). Thus, a viewing angle, which is an angle at which an image may be recognized or viewed without image quality distortion, with respect to the third direction (e.g., the z direction or the −z direction) may increase. In addition, a white angle difference ("WAD") may be improved.

The size of the second sub-pixel P2 and the size of the second hole H2 may be the same as each other. In an embodiment, the second sub-pixel P2 and the second hole H2 may have a substantially same size. In an embodiment, the size of the second red sub-pixel Pr2 and the size of the second hole H2 may be the same as each other, for example. In this case, the light-emitting area emitting red light and the second hole H2 may have a substantially same size. In an embodiment, the width w2 of the second sub-pixel P2 and the width Hw2 of the second hole H2 may be the same as each other. In an embodiment, the width of the second red sub-pixel Pr2 and the width Hw2 of the second hole H2 may be the same as each other, for example.

Light emitted from the second sub-pixel P2 may be emitted in the third direction (e.g., the z direction or the −z direction) and/or a direction substantially same as the third direction (e.g., the z direction or the −z direction). The light emitted from the second sub-pixel P2 may reach a user of the display device, but may not reach other people around the user. In other words, the display device may provide a narrow viewing angle in the second display area DA2.

Figure 5B:
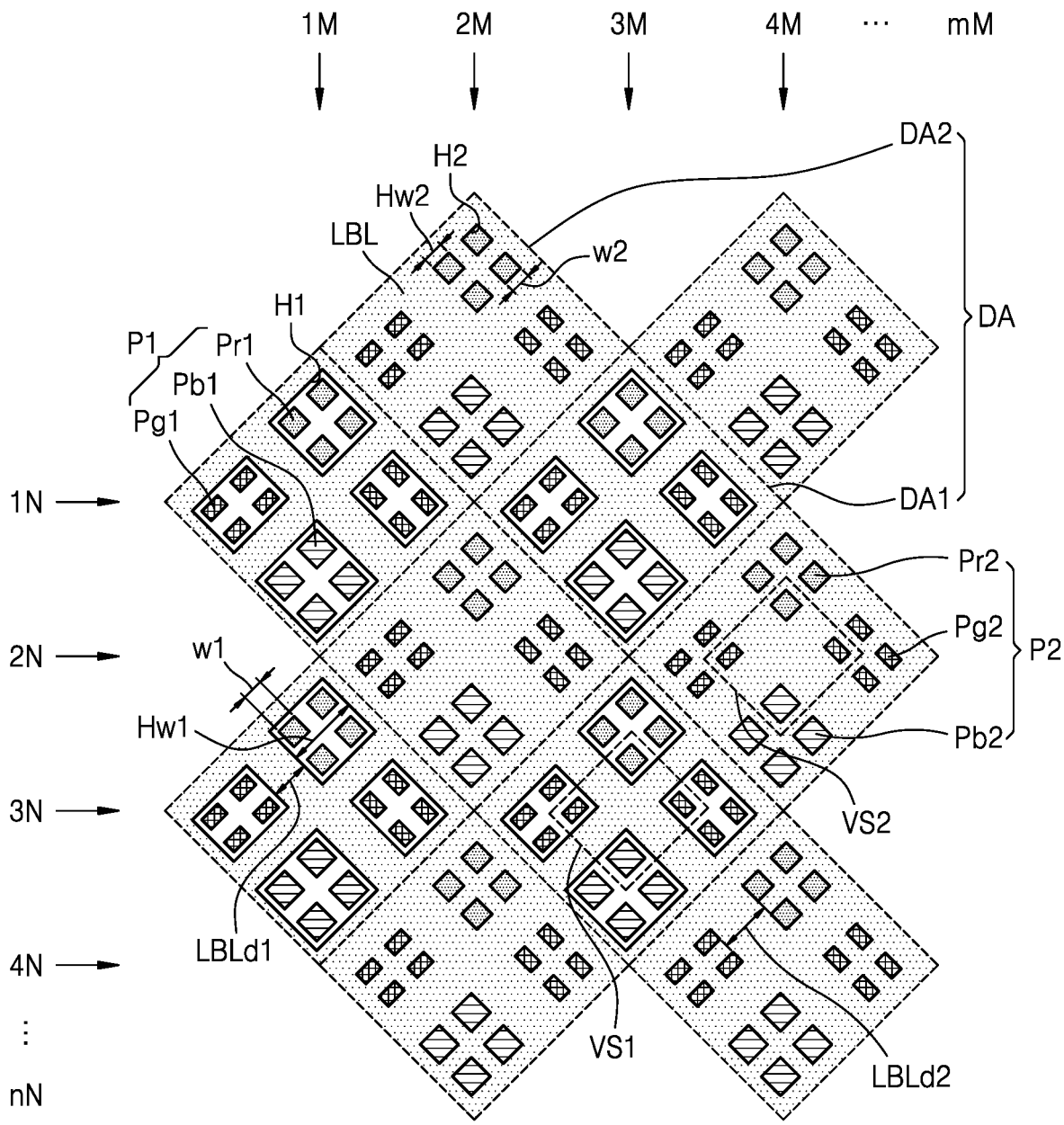
FIG. 5B is an enlarged view of another embodiment of a display area of a display device.

FIG. 5B is an enlarged view of another embodiment of a display area DA of a display device. FIG. 5B is an enlarged view of a region A of the display device 1 in FIG. 4. In FIG. 5B, the same reference symbols as those of FIG. 5A denote the same, and redundant descriptions thereof will be omitted.

Referring to FIG. 5B, the display area DA may include the first display area DA1 and the second display area DA2. In an embodiment, a plurality of first display areas DA1 and a plurality of second display areas DA2 may be provided. In an embodiment, the plurality of first display areas DA1 and the plurality of second display areas DA2 may be arranged in the first direction (e.g., the x direction or the −x direction) and the second direction (e.g., the y direction or the −y direction).

The first sub-pixel P1 may be arranged in the first display area DA1. The first sub-pixel P1 may overlap the first display area DA1. In an embodiment, the first sub-pixel P1 may include the first red sub-pixel Pr1, the first green sub-pixel Pg1, and the first blue sub-pixel Pb1.

In an embodiment, a plurality of first red sub-pixels Pr1, a plurality of first green sub-pixels Pg1, and a plurality of first blue sub-pixels Pb1 may be provided in the first display area DA1. In an embodiment, four first red sub-pixels Pr1 may be arranged in a single first display area DA1, for example. Eight first green sub-pixels Pg1 may be arranged in a single first display area DA1. Four first blue sub-pixels Pb1 may be arranged in a single first display area DA1.

In an embodiment, the first virtual quadrilateral VS1 may be defined in the first display area DA1. The first virtual quadrilateral VS1 may have a first vertex, a second vertex, a third vertex, and a fourth vertex. In an embodiment, the plurality of first red sub-pixels Pr1 may be symmetrically arranged with respect to the first vertex. The four first red sub-pixels Pr1 may be symmetrically arranged with respect to the first vertex. The plurality of first blue sub-pixels Pb1 may be symmetrically arranged with respect to the third vertex facing the first vertex. In an embodiment, the plurality of first blue sub-pixels Pb1 may be symmetrically arranged with respect to the third vertex, for example. The plurality of first green sub-pixels Pg1 may be symmetrically arranged with respect to the second vertex and the fourth vertex facing each other. In an embodiment, the four first green sub-pixels Pg1 may be symmetrically arranged with respect to the second vertex, for example. The four first green sub-pixels Pg1 may be symmetrically arranged with respect to the fourth vertex.

The second sub-pixel P2 may be arranged in the second display area DA2. The second sub-pixel P2 may overlap the second display area DA2. In an embodiment, the second sub-pixel P2 may include the second red sub-pixel Pr2, the second green sub-pixel Pg2, and the second blue sub-pixel Pb2.

The first sub-pixel P1 and the second sub-pixel P2 may have a same size. In an embodiment, the first red sub-pixel Pr1 and the second red sub-pixel Pr2 may have a same size, for example. The first green sub-pixel Pg1 and the second green sub-pixel Pg2 may have a same size. The first blue sub-pixel Pb1 and the second blue sub-pixel Pb2 may have a same size.

A width w1 of the first sub-pixel P1 and a width w2 of the second sub-pixel P2 may be the same as each other. In an embodiment, a width of the first red sub-pixel Pr1 and a width of the second red sub-pixel Pr2 may be the same as each other. A width of the first green sub-pixel Pg1 and a width of the second green sub-pixel Pg2 may be the same as each other. A width of the first blue sub-pixel Pb1 and a width of the second blue sub-pixel Pb2 may be the same as each other.

The light-shielding layer LBL may at least partially absorb external light or internal reflected light. The light-shielding layer LBL may include a black pigment. The light-shielding layer LBL may include a black matrix. The light-shielding layer LBL may be arranged in the display area DA. The light-shielding layer LBL may be arranged in the first display area DA1 and the second display area DA2. The light-shielding layer LBL may overlap the first display area DA1 and the second display area DA2.

The first hole H1 and the second hole H2 may be defined in the light-shielding layer LBL. The first hole H1 and the second hole H2 may penetrate through the light-shielding layer LBL. The first hole H1 may overlap the first display area DA1. A plurality of first holes H1 may be provided.

In an embodiment, the first hole H1 may overlap a plurality of first sub-pixels P1. In an embodiment, one first hole H1 may overlap a plurality of first red sub-pixels Pr1. The plurality of first sub-pixels P1 may be arranged inside one first hole H1, for example. In an embodiment, the plurality of first red sub-pixels Pr1 may be arranged inside one first hole H1, for example.

The second hole H2 may overlap the second display area DA2. A plurality of second holes H2 may be provided. The second holes H2 may overlap the second sub-pixel P2. In an embodiment, the plurality of second holes H2 may overlap the second red sub-pixels Pr2, respectively, for example.

A size of the first hole H1 may be greater than a size of the second hole H2. The size of the first hole H1 may be defined as an area occupied by the first hole H1. The size of second hole H2 may be defined as an area occupied by the second hole H2. In an embodiment, a size of the first hole H1 overlapping the first red sub-pixel Pr1 may be greater than a size of the second hole H2 overlapping the second red sub-pixel Pr2, for example. The width Hw1 of the first hole H1 may be greater than the width Hw2 of the second hole H2.

A ratio of a size of the first hole H1 to a size of the first sub-pixel P1 may be greater than a ratio of a size of the second hole H2 to a size of the second sub-pixel P2. When the size of the first sub-pixel P1 is X and the size of the first hole H1 is Y, a ratio of the size of the first hole H1 to the size of the first sub-pixel P1 may be Y/X. When the size of the second sub-pixel P2 is Z and the size of the second hole H2 is W, a ratio of the size of the second hole H2 to the size of the second sub-pixel P2 may be W/Z.

A ratio of the width Hw1 of the first hole H1 to the width w1 of the first sub-pixel P1 may be greater than a ratio of the width Hw2 of the second hole H2 to the width w2 of the second sub-pixel P2. When the width w1 of the first sub-pixel P1 is X and the width Hw1 of the first hole H1 is Y, a ratio of the width Hw1 of the first hole H1 to the width w1 of the first sub-pixel P1 may be Y/X. When the width w2 of the second sub-pixel P2 is Z and the width Hw2 of the second hole H2 is W, a ratio of the width Hw2 of the second hole H2 to the width w2 of the second sub-pixel P2 may be W/Z.

The size of the first sub-pixel P1 may be less than the size of the first hole H1. In an embodiment, the width w1 of the first sub-pixel P1 may be less than the width Hw1 of the first hole H1.

In an embodiment, a width of the light-shielding layer LBL overlapping the first display area DA1 may be less than a width of the light-shielding layer LBL overlapping the second display area DA2. In an embodiment, a width LBLd1 of the light-shielding layer LBL that extends in the extension direction EDR and overlaps the first display area DA1 may be less than a width LBLd2 of the light-shielding layer LBL that extends in the extension direction EDR and overlaps the second display area DA2, for example. The width LBLd1 of the light-shielding layer LBL extending in the extension direction EDR and overlapping the first display area DA1 may be a distance between first holes H1 adjacent to each other in the extension direction EDR in the first display area DA1. The width LBLd2 of the light-shielding layer LBL extending in the extension direction EDR and overlapping the second display area DA2 may be a distance between second holes H2 adjacent to each other in the extension direction EDR in the second display area DA2.

Figure 5C:
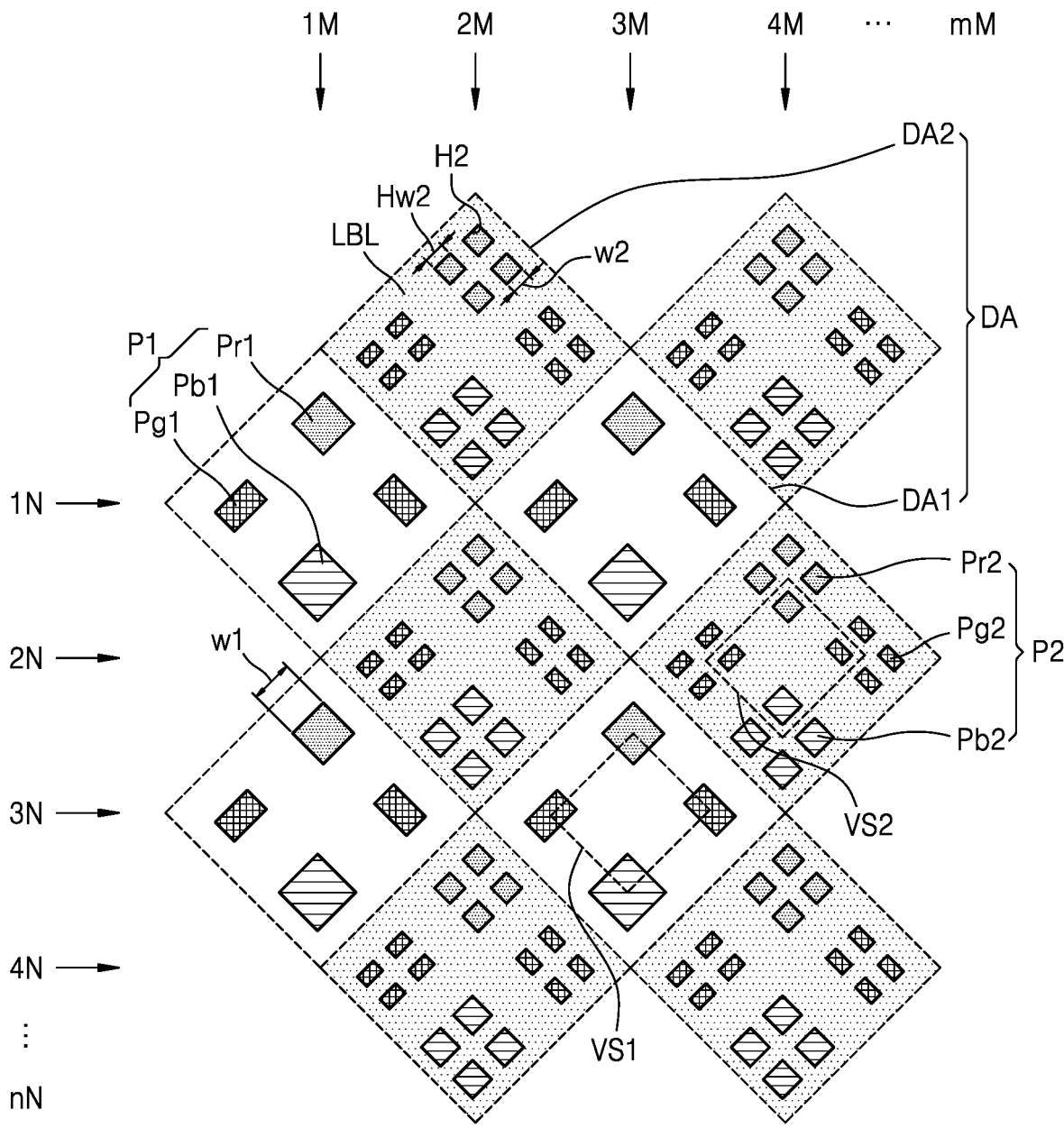
FIG. 5C is a comparative example for comparison with an embodiment of the invention.

FIG. 5C is a comparative example for comparison with an embodiment of the invention.

Referring to FIG. 5C, the light-shielding layer LBL may be arranged in the second display area DA2 and may not be arranged in the first display area DA1. In this case, a reflectance of the display device in the first display area DA1 may be greater than a reflectance of the display device in the second display area DA2. Thus, the user may visually recognize a stain in the display area DA.

In an embodiment of the invention, the light-shielding layer LBL may be arranged in the first display area DA1 and the second display area DA2. Thus, a difference in reflectance between the display device in the first display area DA1 and the display device in the second display area DA2 may be reduced. In addition, a ratio of the width Hw1 of the first hole H1 to the width w1 of the first sub-pixel P1 may be greater than a ratio of the width Hw2 of the second hole H2 to the width w2 of the second sub-pixel P2. Therefore, even though the light-shielding layer LBL is arranged in the first display area DA1, the display device may maintain a wide viewing angle in the first display area DA1 while maintaining the WAD quality.

Figure 6:
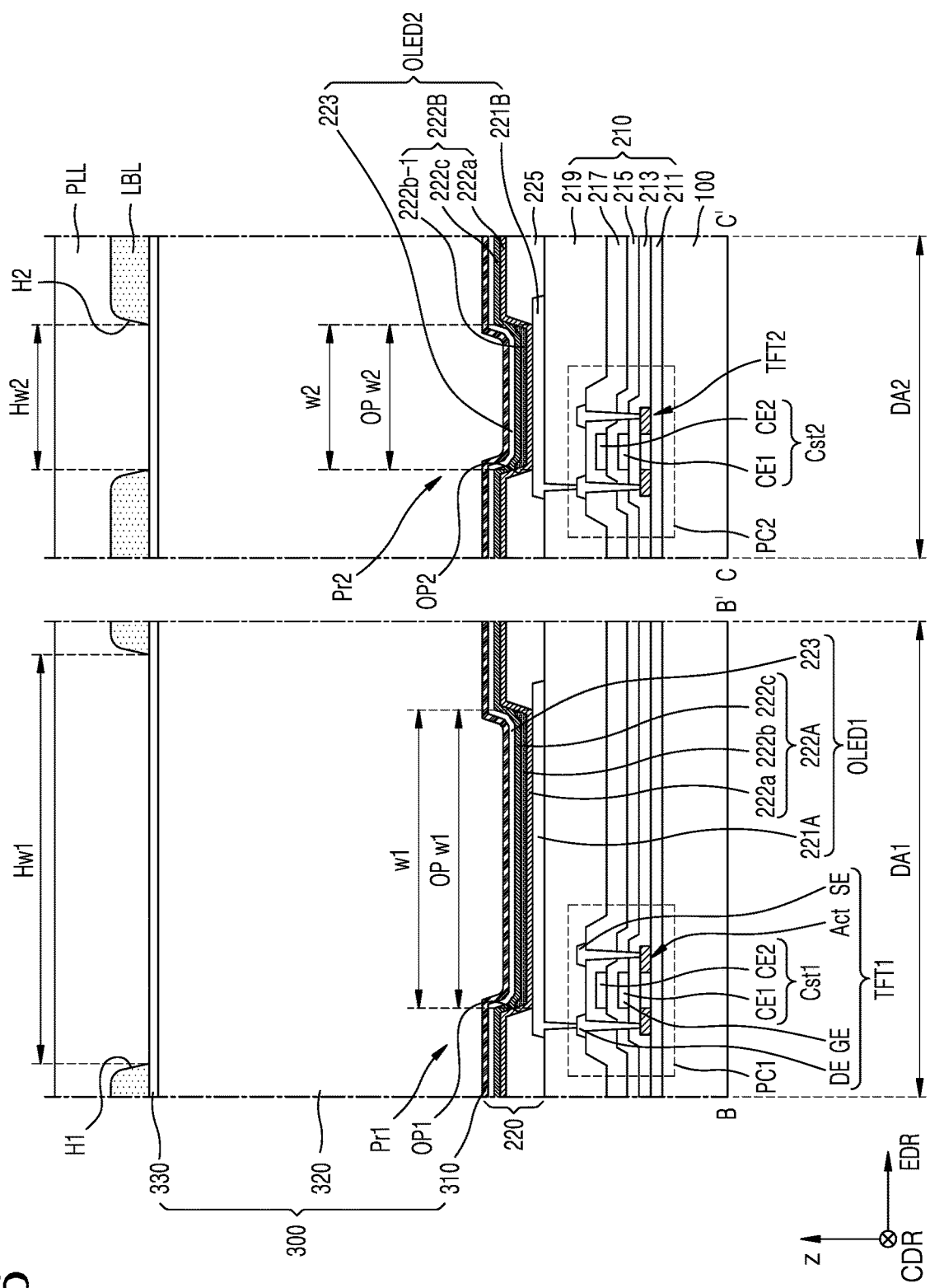
FIG. 6 is a cross-sectional view of an embodiment of a display device.

FIG. 6 is a cross-sectional view of an embodiment of a display device. FIG. 6 is a cross-sectional view of the display device in FIG. 5A, taken along lines B-B' and C-C'.

In FIG. 6, the same reference symbols as those of FIG. 5A denote the same, and redundant descriptions thereof will be omitted.

Referring to FIG. 6, the display device may include a substrate 100, a pixel circuit layer 210, a display element layer 220, an encapsulation layer 300, a light-shielding layer LBL, and a planarization layer PLL.

The pixel circuit layer 210 may be arranged on the substrate 100. The pixel circuit layer 210 may include a buffer layer 211, a first gate insulating layer 213, a second gate insulating layer 215, an interlayer insulating layer 217, an organic insulating layer 219, a first pixel circuit PC1, and a second pixel circuit PC2. The first pixel circuit PC1 may include a first thin-film transistor TFT1 and a first storage capacitor Cst1. The first thin-film transistor TFT1 may include a semiconductor layer Act, a gate electrode GE, a source electrode SE, and a drain electrode DE. The second pixel circuit PC2 may include a second thin-film transistor TFT2 and a second storage capacitor Cst2. Because the second pixel circuit PC2 is similar to the first pixel circuit PC1, the first pixel circuit PC1 will be mainly described below in detail.

The buffer layer 211 may be arranged on the substrate 100. In an embodiment, the buffer layer 211 may include an inorganic insulating material, such as silicon nitride ($SiN_x$), silicon oxynitride (SiON), and silicon oxide ($SiO_2$), and may be a single layer or multiple layers including the aforementioned inorganic insulating material.

Each of the first thin-film transistor TFT1 and the second thin-film transistor TFT2 may include a semiconductor layer Act, which may be arranged on the buffer layer 211. The semiconductor layer Act may include polysilicon. In some embodiments, the semiconductor layer Act may include amorphous silicon, semiconductor oxide, organic semiconductor, etc. The semiconductor layer Act may include a channel area, a drain area, and a source area, and the drain area and the source area may be respectively arranged at opposite sides of the channel area.

The gate electrode GE may overlap the channel area. The gate electrode GE may include low-resistance metal material. In an embodiment, the gate electrode GE may include a conductive material including molybdenum (Mo), aluminum (Al), copper (Cu), titanium (Ti), or the like, and may include a single layer or multiple layers including the above material.

In an embodiment, the first gate insulating layer 213 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 215 may cover the gate electrode GE. Similar to the first gate insulating layer 213, in an embodiment, the second gate insulating layer 215 may include an inorganic insulating material, such as $SiO_2$, $SiN_x$, SiON, $Al_2O_3$, $TiO_2$, $Ta_2O_5$, $HfO_2$, or ZnO.

An upper electrode CE2 of the first storage capacitor Cst1 may be arranged on the second gate insulating layer 215. The upper electrode CE2 may overlap the gate electrode GE therebelow. In this case, the gate electrode GE and the upper electrode CE2 overlapping each other with the second gate insulating layer 215 therebetween may form the first storage capacitor Cst1. In other words, the gate electrode GE may function as a lower electrode CE1 of the first storage capacitor Cst1.

In an embodiment, the first storage capacitor Cst1 and the first thin-film transistor TFT1 may be provided so as to overlap each other. The second storage capacitor Cst2 and the second thin-film transistor TFT2 may be provided so as to overlap each other. In some embodiments, the first storage capacitor Cst1 may be provided so as not to overlap the first thin-film transistor TFT1. The second storage capacitor Cst2 may be provided so as not to overlap the second thin-film transistor TFT2.

In an embodiment, an upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may have a single layer or multiple layers of the above materials.

The interlayer insulating layer 217 may cover the upper electrode CE2. In an embodiment, the interlayer insulating layer 217 may include $SiO_2$, $SiN_x$, SiON, $Al_2O_3$, $TiO_2$, $Ta_2O_5$, $HfO_2$, or ZnO. The interlayer insulating layer 217 may include a single layer or multiple layers including the inorganic insulating materials described above.

The drain electrode DE and the source electrode SE may be disposed on the interlayer insulating layer 217. Each of the drain electrode DE and the source electrode SE may include a material having good conductivity. In an embodiment, each of the drain electrode DE and the source electrode SE may include a conductive material including Mo, Al, Cu, Ti, etc., and may have a single layer or multiple layers including the above material. In an embodiment, the drain electrode DE and the source electrode SE may have a multi-layered structure of a Ti layer, an Al layer, and another Ti layer.

The organic insulating layer 219 may be arranged to cover the drain electrode DE and the source electrode SE. In an embodiment, the organic insulating layer 219 may include an organic insulating material such as a general-purpose polymer (e.g., poly(methyl methacrylate) ("PMMA") or polystyrene ("PS")), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or any blends thereof. In some embodiments, the organic insulating layer 219 may include a first organic insulating layer and a second organic insulating layer.

The display element layer 220 may be arranged on the pixel circuit layer 210. The display element layer 220 may be arranged on the organic insulating layer 219. The display element layer 220 may include a first organic light-emitting diode OLED1 and a second organic light-emitting diode OLED2 as display elements, and a pixel-defining layer 225.

The first organic light-emitting diode OLED1 and the second organic light-emitting diode OLED2 may be arranged on the organic insulating layer 219. Each of the first organic light-emitting diode OLED1 and the second organic light-emitting diode OLED2 may emit one of red light, green light, and blue light, or may emit one of red light, green light, blue light, and white light. Hereinafter, a detailed description will be given focusing on the case where each of the first organic light-emitting diode OLED1 and the second organic light-emitting diode OLED2 emits red light.

The first organic light-emitting diode OLED1 may include a first electrode 221A, a first intermediate layer 222A, and a common electrode 223. The first organic light-emitting diode OLED1 may implement a first red sub-pixel Pr1. The second organic light-emitting diode OLED2 may include a second electrode 221B, a second intermediate layer 222B, and a common electrode 223. The second organic light-emitting diode OLED2 may implement a second red sub-pixel Pr2.

The first electrode 221A and the second electrode 221B may be arranged on the substrate 100. The first electrode 221A and the second electrode 221B may be arranged on the organic insulating layer 219. The first electrode 221A may overlap a first display area DA1. The second electrode 221B may overlap a second display area DA2.

The first electrode 221A and the second electrode 221B may be electrically connected to the first thin-film transistor TFT1 and the second thin-film transistor TFT2, respectively, through a contact hole of the organic insulating layer 219. In an embodiment, at least one of the first electrode 221A and the second electrode 221B may include a conductive oxide, such as indium tin oxide ("ITO"), indium zinc oxide ("IZO"), ZnO, indium oxide ($In_2O_3$), indium gallium oxide ("IGO"), or aluminum zinc oxide ("AZO"). In another embodiment, at least one of the first electrode 221A and the second electrode 221B may include a reflective film including Ag, Mg, Al, Pt, Pd, Au, Ni, Nd, Ir, Cr, or any combinations thereof. In another embodiment, at least one of the first electrode 221A and the second electrode 221B may further include a film including ITO, IZO, ZnO, or $In_2O_3$, above/below the above-described reflective film. In an embodiment, at least one of the first electrode 221A and the second electrode 221B may have a multi-layered structure of an ITO layer, an Ag layer, and another ITO layer, for example.

The pixel-defining layer 225 may cover edges of the first electrode 221A and edges of the second electrode 221B. A first opening OP1 and a second opening OP2 may be defined in the pixel-defining layer 225. The first opening OP1 may expose a central portion of the first electrode 221A. The first opening OP1 may define a light-emitting area of light emitted from the first organic light-emitting diode OLED1. In an embodiment, a size of the first opening OP1 may be a size of the first red sub-pixel Pr1. A width OPw1 of the first opening OP1 may be a width w1 of the first red sub-pixel Pr1. The width OPw1 of the first opening OP1 may be defined as a shortest distance between side surfaces of the pixel-defining layer 225 defining the first opening OP1.

The second opening OP2 may expose a central portion of the second electrode 221B. The second opening OP2 may define a light-emitting area of light emitted from the second organic light-emitting diode OLED2. In an embodiment, a size of the second opening OP2 may be a size of the second red sub-pixel Pr2. A width OPw2 of the second opening OP2 may be a width w2 of the second red sub-pixel Pr2. The width OPw2 of the second opening OP2 may be defined as a shortest distance between sides of the pixel-defining layer 225 that defines the second opening OP2.

The first intermediate layer 222A may include a first functional layer 222a, a first emission layer 222b, and a second functional layer 222c. The second intermediate layer 222B may include a first functional layer 222a, a second emission layer 222b-1, and a second functional layer 222c. Each of the first emission layer 222b and the second emission layer 222b-1 may include a polymer or a low-molecular-weight organic material that emits light of a color.

In an embodiment, at least one of the first functional layer 222a and the second functional layer 222c may be a common layer entirely arranged in the first and second display areas DA1 and DA2. In an embodiment, the first functional layer 222a may include a hole transport layer ("HTL"), or may include an HTL and a hole injection layer ("HIL"), for example. The second functional layer 222c may include an electron transport layer ("ETL") and/or an electron injection layer ("EIL"). In some embodiments, the second functional layer 222c may be omitted.

The common electrode 223 may be arranged on the first emission layer 222b and the second emission layer 222b-1. The common electrode 223 may include a conductive material having a low work function. In an embodiment, the common electrode 223 may include a (semi-)transparent layer including Ag, Mg, Al, Pt, Pd, Au, Ni, Nd, Ir, Cr, Li, Ca, or any alloys thereof, for example. In some embodiments, the common electrode 223 may further include a layer such as an ITO layer, an IZO layer, a ZnO layer, or an $In_2O_3$ layer, on the (semi-)transparent layer including the material described above.

In some embodiments, a capping layer (not shown) may be further arranged on the common electrode 223. The capping layer may include lithium fluoride (LiF), an inorganic material, and/or an organic material.

The encapsulation layer 300 may be arranged on the display element layer 220. The encapsulation layer 300 may cover the first organic light-emitting diode OLED1 and the second organic light-emitting diode OLED2. In an embodiment, the encapsulation layer 300 may include at least one inorganic encapsulation layer and at least one organic encapsulation layer. FIG. 6 shows that the encapsulation layer 300 includes a first inorganic encapsulation layer 310, a first organic encapsulation layer 320, and a second inorganic encapsulation layer 330, which are sequentially stacked. In an embodiment, a thickness of the first organic encapsulation layer 320 may be about 20 micrometers (μm). The thickness of the first organic encapsulation layer 320 may be a distance from an upper surface of the first inorganic encapsulation layer 310 overlapping the first opening OP1 or the second opening OP2 to a lower surface of the second inorganic encapsulation layer 330. In an embodiment, the thickness of the first organic encapsulation layer 320 may be greater than about 20 μm. In an embodiment, the thickness of the first organic encapsulation layer 320 may be less than about 20 μm.

In an embodiment, the at least one inorganic encapsulation layer may include at least one inorganic material from among $Al_2O_3$, $TiO_2$, $Ta_2O_5$, $HfO_2$, ZnO, $SiO_2$, $SiN_X$, and SiON. In an embodiment, the first inorganic encapsulation layer 310 may include SiON. The second inorganic encapsulation layer 330 may include $SiN_X$.

The at least one organic encapsulation layer may include a polymer-based material. The polymer-based material may include acryl-based resins, epoxy-based resins, polyimide, polyethylene, and the like. In an embodiment, the at least one organic encapsulation layer may include acrylate.

The light-shielding layer LBL may be arranged on the display element layer 220. In an embodiment, the light-shielding layer LBL may be arranged on the at least one inorganic encapsulation layer. In an embodiment, the light-shielding layer LBL may be arranged on the second inorganic encapsulation layer 330. The light-shielding layer LBL may overlap the pixel-defining layer 225.

The first hole H1 and the second hole H2 may be defined in the light-shielding layer LBL. The first hole H1 and the second hole H2 may penetrate through the light-shielding layer LBL. The first hole H1 may overlap the first display area DA1. In an embodiment, the first hole H1 may overlap the first red sub-pixel Pr1, for example. The first hole H1 may overlap the first organic light-emitting diode OLED1. The first hole H1 may overlap the first electrode 221A. In some embodiments, one first hole H1 may overlap a plurality of first red sub-pixels Pr1. One first hole H1 may overlap a plurality of first organic light-emitting diodes OLED1. One first hole H1 may overlap a plurality of first electrodes 221A.

The second hole H2 may overlap the second display area DA2. In an embodiment, the second hole H2 may overlap the second red sub-pixel Pr2, for example. The second hole H2 may overlap the second organic light-emitting diode OLED2. The second hole H2 may overlap the second electrode 221B.

A size of the first hole H1 may be greater than a size of the second hole H2. A width Hw1 of the first hole H1 may be greater than a width Hw2 of the second hole H2. The width Hw1 of the first hole H1 may be a shortest distance between the light-shielding layers LBL that defines the first hole H1. The width Hw2 of the second hole H2 may be a shortest distance between the light-shielding layers LBL that defines the second hole H2.

A ratio of a size of the first hole H1 to a size of the first sub-pixel P1 (refer to FIGS. 5A to 5C) may be greater than a ratio of a size of the second hole H2 to a size of the second sub-pixel P2. A ratio of the width Hw1 of the first hole H1 to the width w1 of the first sub-pixel P1 may be greater than a ratio of the width Hw2 of the second hole H2 to the width w2 of the second sub-pixel P2 (refer to FIGS. 5A to 5C).

A ratio of the width Hw1 of the first hole H1 to the width OPw1 of the first opening OP1 may be greater than a ratio of the width Hw2 of the second hole H2 to the width OPw2 of the second opening OP2. When the width OPw1 of the first opening OP1 is X and the width Hw1 of the first hole H1 is Y, a ratio of the width Hw1 of the first hole H1 to the width OPw1 of the first opening OP1 may be Y/X. When the width OPw2 of the second hole OP2 is Z and the width Hw2 of the second hole H2 is W, a ratio of the width Hw2 of the second hole H2 to the width OPw2 of the second opening OP2 may be W/Z.

The light-shielding layer LBL may be arranged in the first display area DA1 and the second display area DA2. Thus, a difference in reflectance between a display device in the first display area DA1 and the display device in the second display area DA2 may be reduced. In addition, a ratio of the width Hw1 of the first hole H1 to the width OPw1 of the first opening OP1 may be greater than a ratio of the width Hw2 of the second hole H2 to the width OPw2 of the second opening OP2. Thus, the display device may maintain a wide viewing angle in the first display area DA1 even though the light-shielding layer LBL is arranged in the first display area DA1.

The size of the first opening OP1 may be less than the size of the first hole H1. In this case, the size of the first hole H1 may be greater than a light-emitting area emitting red light. In an embodiment, the width OPw1 of the first opening OP1 may be less than the width Hw1 of the first hole H1.

Light emitted from the first organic light-emitting diode OLED1 may be emitted in a third direction (e.g., a z direction or a -z direction). In addition, light emitted from the first organic light-emitting diode OLED1 may be emitted in a direction oblique to the third direction (e.g., the z direction or the -z direction). Thus, a viewing angle, which is an angle at which an image may be recognized or viewed without image quality distortion, with respect to the third direction (e.g., the z direction or the -z direction) may increase. In addition, a WAD may be improved.

The size of the second opening OP2 and the size of the second hole H2 may be the same as each other. In an embodiment, the second opening OP2 and the second hole H2 may have a substantially same size. In this case, the light-emitting area emitting red light and the second hole H2 may have a substantially same size. In an embodiment, the width OPw2 of the second opening OP2 and the width Hw2 of the second hole H2 may be the same as each other.

Light emitted from the second organic light-emitting diode OLED2 may be emitted in the third direction (e.g., the z direction or the -z direction) and/or a direction substantially same as the third direction (e.g., the z direction or the -z direction). The light emitted from the second organic light-emitting diode OLED2 may reach a user of the display device, but may not reach other people around the user. In other words, the display device may provide a narrow viewing angle in the second display area DA2.

The planarization layer PLL may be arranged on the light-shielding layer LBL. In an embodiment, the planarization layer PLL may fill the first hole H1 and the second hole H2 of the light-shielding layer LBL. An upper surface of the planarization layer PLL may be substantially flat, and may include an organic material such as acryl, benzocyclobutene ("BCB"), or hexamethyldisiloxane ("HMDSO").

Figure 7:
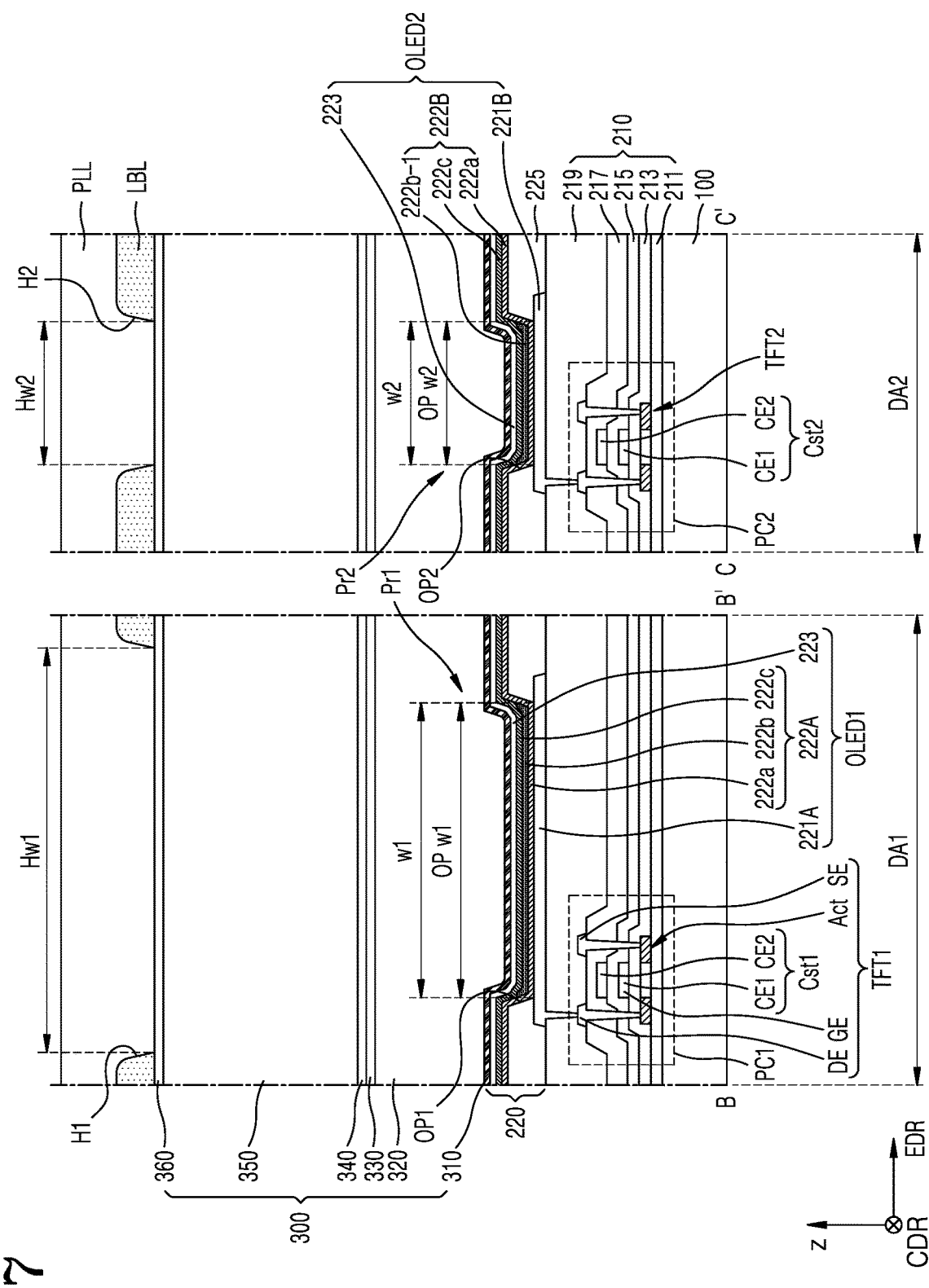
FIG. 7 is a cross-sectional view of another embodiment of a display device.

FIG. 7 is a cross-sectional view of another embodiment of a display device. FIG. 7 is a cross-sectional view of the display device in FIG. 5A, taken along lines B-B' and C-C'. In FIG. 7, the same reference symbols as those of FIG. 6 denote the same, and redundant descriptions thereof will be omitted.

Referring to FIG. 7, the display device may include a substrate 100, a pixel circuit layer 210, a display element layer 220, an encapsulation layer 300, a light-shielding layer LBL, and a planarization layer PLL.

The substrate 100 may include a first display area DA1 and a second display area DA2.

The display element layer 220 may include a first organic light-emitting diode OLED1, a second organic light-emitting diode OLED2, and a pixel-defining layer 225. The first organic light-emitting diode OLED1 is arranged on the substrate 100 and may include the first electrode 221A overlapping the first display area DA1. The second organic light-emitting diode OLED2 is arranged on the substrate 100 and may include a second electrode 221B overlapping the second display area DA2. The pixel-defining layer 225 may cover edges of the first electrode 221A, and a first opening OP1 exposing a central portion of the first electrode 221A may be defined in the pixel-defining layer 225. The pixel-defining layer 225 may cover edges of the second electrode 221B, and a second opening OP2 exposing a central portion of the second electrode 221B may be defined in the pixel-defining layer 225.

The first organic light-emitting diode OLED1 may implement a first red sub-pixel Pr1 in the first display area DA1. A width OPw1 of the first opening OP1 may be a width w1 of the first red sub-pixel Pr1. The second organic light-emitting diode OLED2 may implement a second red sub-pixel Pr2 in the second display area DA2. A width OPw2 of the second opening OP2 may be a width w2 of the second red sub-pixel Pr2.

The encapsulation layer 300 may be arranged on the display element layer 220. The encapsulation layer 300 may cover the first organic light-emitting diode OLED1 and the second organic light-emitting diode OLED2. In an embodiment, the encapsulation layer 300 may include at least one inorganic encapsulation layer and at least one organic encapsulation layer. FIG. 7 shows that the encapsulation layer 300 includes a first inorganic encapsulation layer 310, a first organic encapsulation layer 320, a second inorganic encapsulation layer 330, a third inorganic encapsulation layer 340, a second organic encapsulation layer 350, and a fourth inorganic encapsulation layer 360 that are sequentially stacked.

In an embodiment, the light-shielding layer LBL may be arranged on the at least one inorganic encapsulation layer. In an embodiment, the light-shielding layer LBL may be arranged on the fourth inorganic encapsulation layer 360, for example.

A first hole H1 overlapping the first opening OP1 and a second hole H2 overlapping the second opening OP2 may be defined in the light-shielding layer LBL. The first hole H1 may overlap the first red sub-pixel Pr1, and the second hole H2 may overlap the second red sub-pixel Pr2.

A ratio of a width Hw1 of the first hole H1 to the width OPw1 of the first opening OP1 may be greater than a ratio of a width Hw2 of the second hole H2 to the width OPw2 of the second opening OP2. A ratio of the width Hw1 of the first hole H1 to the width w1 of the first red sub-pixel Pr1 may be greater than a ratio of the width Hw2 of the second hole H2 to the width w2 of the second red sub-pixel Pr2.

In an embodiment, a thickness of the first organic encapsulation layer 320 may be about 8.8 μm. A thickness of the first organic encapsulation layer 320 may be a distance from an upper surface of the first inorganic encapsulation layer 310 overlapping the first opening OP1 or the second opening OP2 to a lower surface of the second inorganic encapsulation layer 330. In an embodiment, the thickness of the first organic encapsulation layer 320 may be greater than about 8.8 μm. In an embodiment, the thickness of the first organic encapsulation layer 320 may be less than about 8.8 μm.

In an embodiment, a thickness of the second organic encapsulation layer 350 may be about 8.8 μm. The thickness of the second organic encapsulation layer 350 may be a distance from an upper surface of the third inorganic encapsulation layer 340 to a lower surface of the fourth inorganic encapsulation layer 360. In an embodiment, the thickness of the second organic encapsulation layer 350 may be greater than about 8.8 μm. In an embodiment, the thickness of the second organic encapsulation layer 350 may be less than about 8.8 μm.

In an embodiment, the first inorganic encapsulation layer 310 may include SiON. The second inorganic encapsulation layer 330 may include $SiN_x$. In an embodiment, the third inorganic encapsulation layer 340 may include SiON. In an embodiment, the fourth inorganic encapsulation layer 360 may include $SiN_x$.

Figure 8:
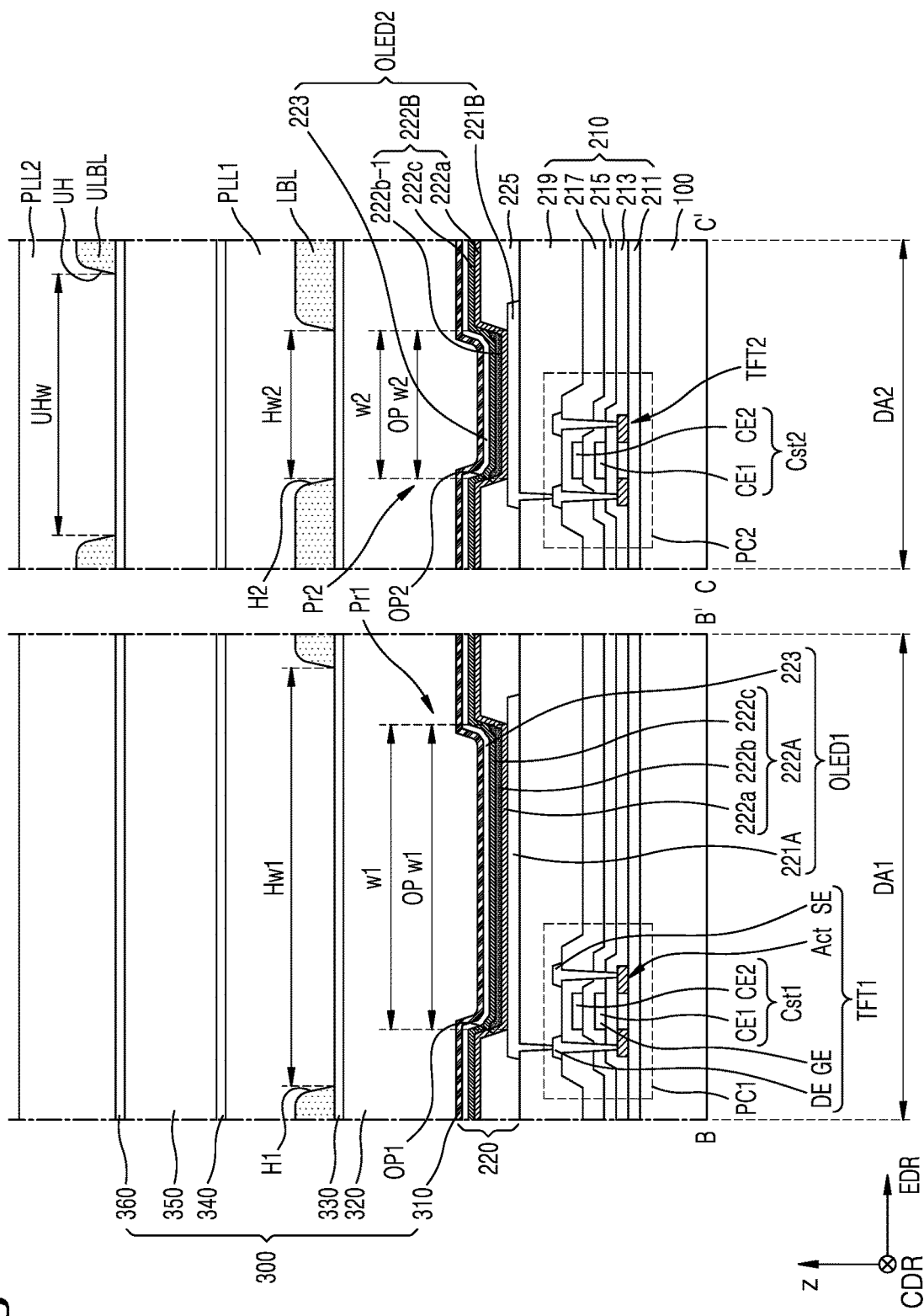
FIG. 8 is a cross-sectional view of another embodiment of a display device.

FIG. 8 is a cross-sectional view of another embodiment of a display device. FIG. 8 is a cross-sectional view of the display device in FIG. 5A, taken along lines B-B' and C-C'. In FIG. 8, the same reference symbols as those of FIG. 7 denote the same, and redundant descriptions thereof will be omitted.

Referring to FIG. 8, the display device may include a substrate 100, a pixel circuit layer 210, a display element layer 220, an encapsulation layer 300, a light-shielding layer LBL, a first planarization layer PLL1, an upper light-shielding layer ULBL, and a second planarization layer PLL2.

The substrate 100 may include a first display area DA1 and a second display area DA2.

The display element layer 220 may include a first organic light-emitting diode OLED1, a second organic light-emitting diode OLED2, and a pixel-defining layer 225. The first organic light-emitting diode OLED1 is arranged on the substrate 100 and may include a first electrode 221A overlapping the first display area DA1. The second organic light-emitting diode OLED2 is arranged on the substrate 100 and may include a second electrode 221B overlapping the second display area DA2. The pixel-defining layer 225 may cover edges of the first electrode 221A, and a first opening OP1 exposing a central portion of the first electrode 221A may be defined in the pixel-defining layer 225. The pixel-defining layer 225 may cover edges of the second electrode 221B, and a second opening OP2 exposing a central portion of the second electrode 221B may be defined in the pixel-defining layer 225.

The first organic light-emitting diode OLED1 may implement a first red sub-pixel Pr1 in the first display area DA1. A width OPw1 of the first opening OP1 may correspond to a width w1 of the first red sub-pixel Pr1. The second organic light-emitting diode OLED2 may implement a second red sub-pixel Pr2 in the second display area DA2. A width OPw2 of the second opening OP2 may be a width w2 of the second red sub-pixel Pr2.

The encapsulation layer 300 may be arranged on the display element layer 220. The encapsulation layer 300 may cover the first organic light-emitting diode OLED1 and the second organic light-emitting diode OLED2. In an embodiment, the encapsulation layer 300 may include at least one inorganic encapsulation layer and at least one organic encapsulation layer. FIG. 8 shows that the encapsulation layer 300 includes a first inorganic encapsulation layer 310, a first organic encapsulation layer 320, a second inorganic encapsulation layer 330, a third inorganic encapsulation layer 340, a second organic encapsulation layer 350, and a fourth inorganic encapsulation layer 360 that are sequentially stacked.

In an embodiment, the light-shielding layer LBL may be arranged on the at least one inorganic encapsulation layer. In an embodiment, the light-shielding layer LBL may be arranged on the second inorganic encapsulation layer 330, for example.

A first hole H1 overlapping the first opening OP1 and a second hole H2 overlapping the second opening OP2 may be defined in the light-shielding layer LBL. The first hole H1 may overlap the first red sub-pixel Pr1, and the second hole H2 may overlap the second red sub-pixel Pr2.

A ratio of a width Hw1 of the first hole H1 to the width OPw1 of the first opening OP1 may be greater than a ratio of a width Hw2 of the second hole H2 to the width OPw2 of the second opening OP2. A ratio of the width Hw1 of the first hole H1 to the width w1 of the first red sub-pixel Pr1 may be greater than a ratio of the width Hw2 of the second hole H2 to the width w2 of the second red sub-pixel Pr2.

The first planarization layer PLL1 may be arranged on the light-shielding layer LBL. In an embodiment, the first planarization layer PLL1 may fill the first hole H1 and the second hole H2 of the light-shielding layer LBL. An upper surface of the first planarization layer PLL1 may be substantially flat, and may include an organic material, such as acryl, BCB, or HMDSO.

The third inorganic encapsulation layer 340, the second organic encapsulation layer 350, and the fourth inorganic encapsulation layer 360 may be sequentially stacked on the first planarization layer PLL1.

The upper light-shielding layer ULBL may be arranged on the fourth inorganic encapsulation layer 360. The upper light-shielding layer ULBL may at least partially absorb external light or internal reflected light. The upper light-shielding layer ULBL may include a black pigment. The upper light-shielding layer ULBL may include a black matrix. The upper light-shielding layer ULBL may be arranged in the second display area DA2. In an embodiment, the upper light-shielding layer ULBL may not be arranged in the first display area DA1. The upper light-shielding layer ULBL may be spaced apart from the first display area DA1.

Light emitted from the first organic light-emitting diode OLED1 may be emitted in a direction oblique to a third direction (e.g., a z direction or a −z direction). Thus, a viewing angle, which is an angle at which an image may be recognized or viewed without image quality distortion, with respect to the third direction (e.g., the z direction or the −z direction) may increase.

An upper hole UH may be defined in the upper light-shielding layer ULBL. The upper hole UH may penetrate through the upper light-shielding layer ULBL. The upper hole UH may overlap the second display area DA2.

The upper hole UH may overlap the second electrode 221B. The upper hole UH may overlap the second opening OP2. The upper hole UH may overlap the second red sub-pixel Pr2.

The upper light-shielding layer ULBL may be arranged farther away from the second organic light-emitting diode OLED2 than the light-shielding layer LBL is from the organic light-emitting diode OLED2. In this case, the upper light-shielding layer ULBL may reduce propagation of light emitted from the second organic light-emitting diode OLED2 in a direction crossing the third direction (e.g., the z direction or the −z direction). Thus, light traveling in a direction crossing the third direction (e.g., the z direction or the −z direction) from the second organic light-emitting diode OLED2 may be at least partially removed. The light emitted from the second organic light-emitting diode OLED2 may reach a user of the display device, but may not reach other people around the user. In other words, the display device may provide a narrow viewing angle in the second display area DA2.

In an embodiment, a size of the upper hole UH may be greater than a size of the second hole H2. The size of the upper hole UH may be defined as an area occupied by the upper hole UH. A width UHw of the upper hole UH may be greater than the width Hw2 of the second hole H2. The width UHw of the upper hole UH may be a shortest distance between the upper light-shielding layers ULBL defining the upper hole UH.

In an embodiment, because a size of the upper hole UH is greater than a size of the second hole H2, a difference in reflectance between the display device in the first display area DA1 and the display device in the second display area DA2 may be reduced.

In an embodiment, a ratio of a size of the first hole H1 to a size of the first red sub-pixel Pr1 may be the same as a ratio of the size of the upper hole UH to a size of the second red sub-pixel Pr2. In an embodiment, a ratio of the width Hw1 of the first hole H1 to the width w1 of the first red sub-pixel Pr1 may be the same as a ratio of the width UHw of the upper hole UH to the width w2 of the second red sub-pixel Pr2.

In an embodiment, a ratio of the size of the first hole H1 to the size of the first opening OP1 may be the same as a ratio of the size of the upper hole UH to the size of the second opening OP2. In an embodiment, a ratio of the width Hw1 of the first hole H1 to the width OPw1 of the first opening OP1 may be the same as a ratio of the width UHw of the upper hole UH to the width OPw2 of the second opening OP2.

In another embodiment, the size of the upper hole UH may be less than or equal to the size of the second hole H2. The width UHw of the upper hole UH may be less than or equal to the width Hw2 of the second hole H2. In this case, the display device may provide a narrower viewing angle in the second display area DA2.

The second planarization layer PLL2 may be arranged on the upper light-shielding layer ULBL. In an embodiment, the second planarization layer PLL2 may fill the upper hole UH of the upper light-shielding layer ULBL. An upper surface of the second planarization layer PLL2 may be substantially flat and may include an organic material, such as acryl, BCB, or HMDSO.

Figure 9A:
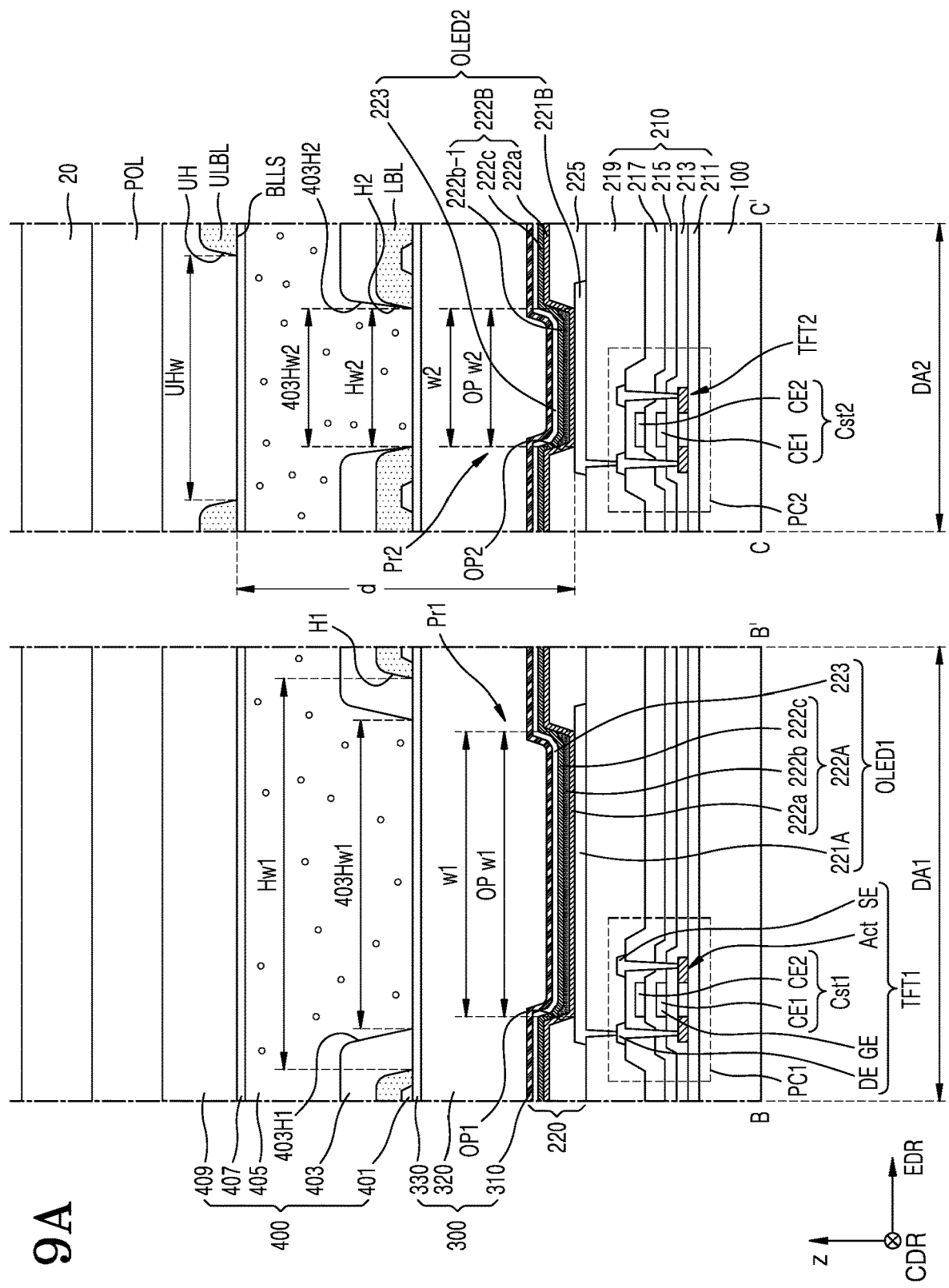
FIGS. 9A and 9B are cross-sectional views of another embodiment of a display device.
Figure 9B:
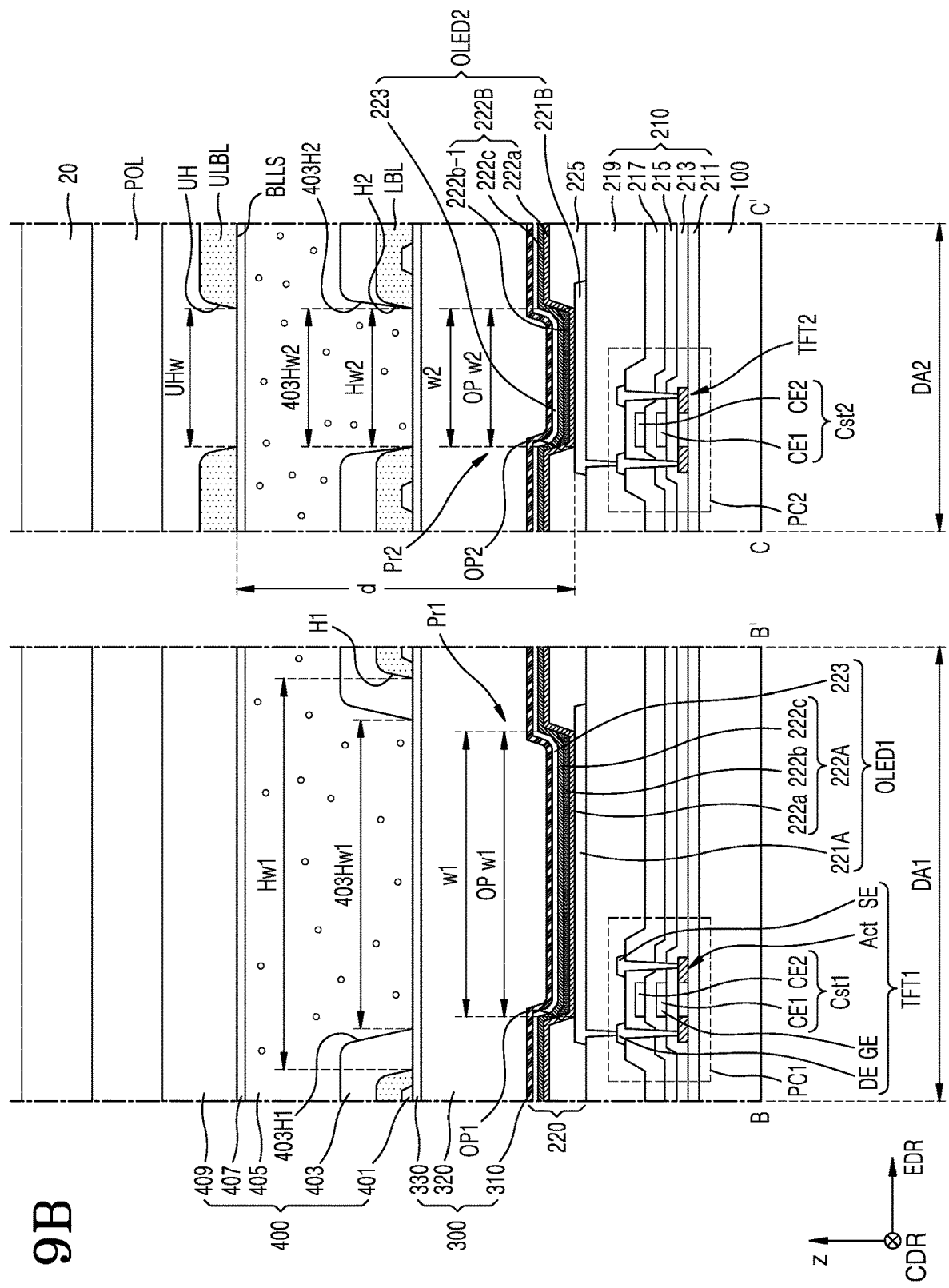
Figure 10:
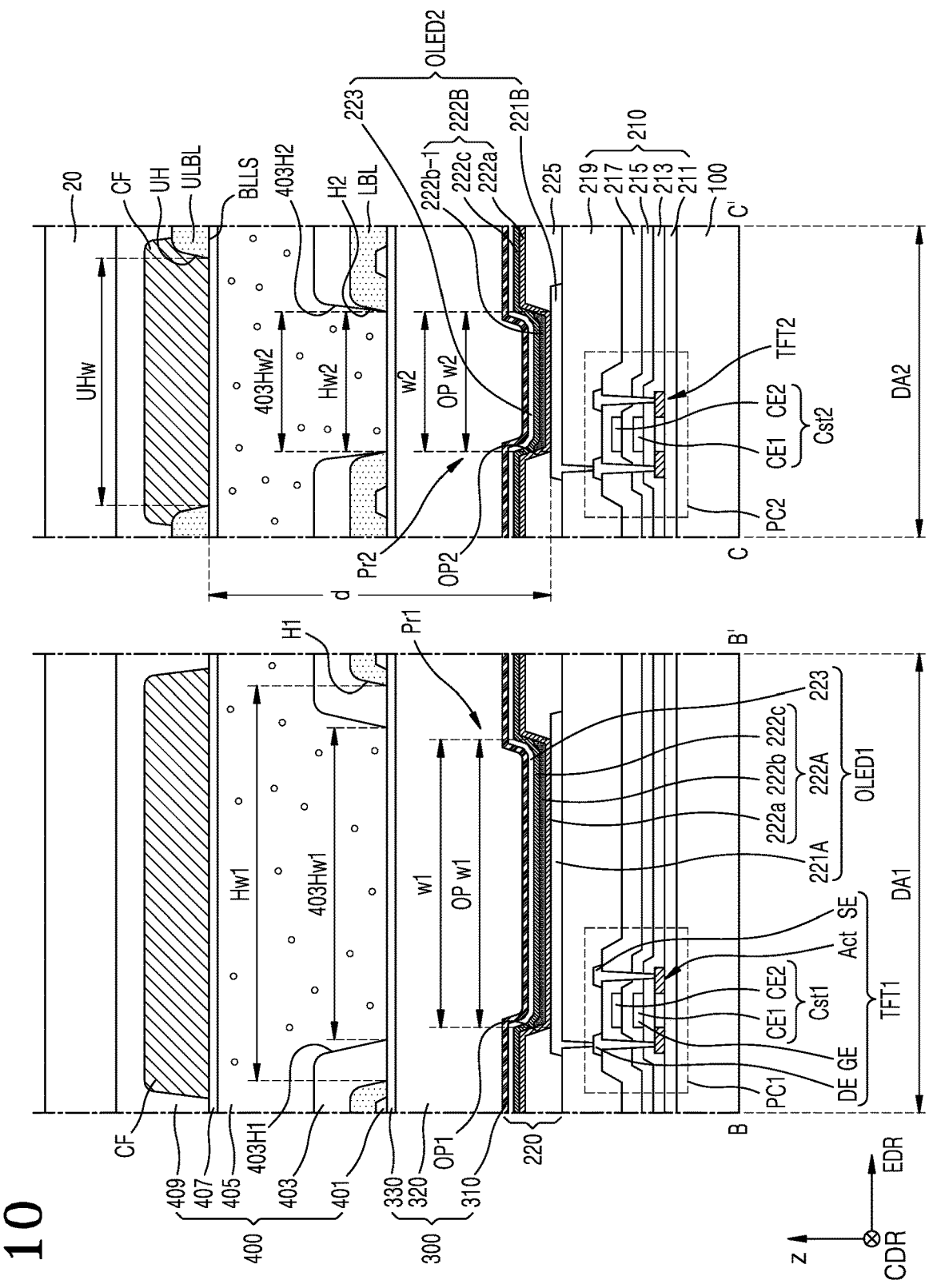
FIGS. 10 and 11 are cross-sectional views of another embodiment of a display device.
Figure 11:
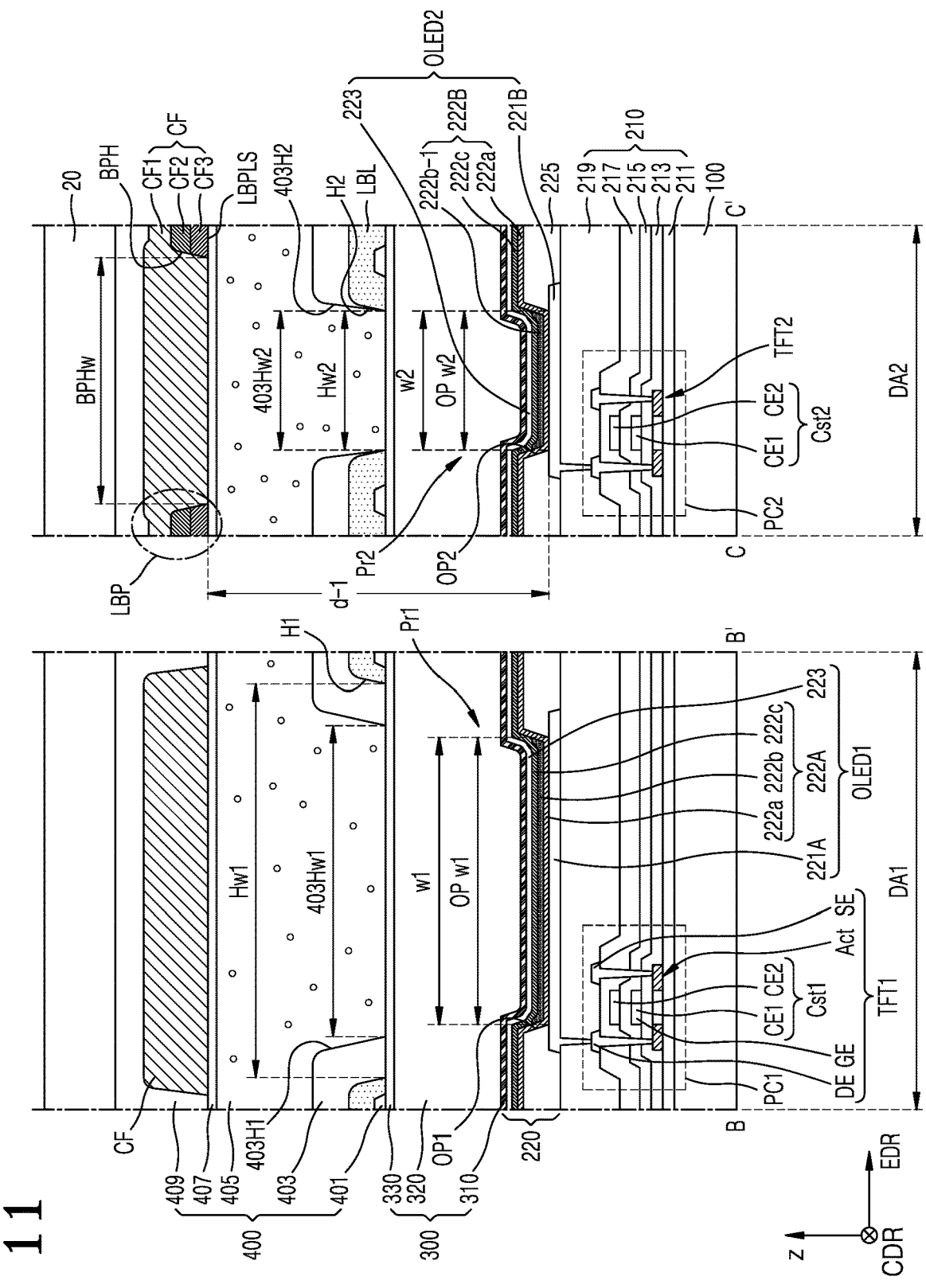

FIGS. 9A and 9B are cross-sectional views of another embodiment of a display device. FIGS. 10 and 11 are cross-sectional views of another embodiment of a display device. FIGS. 9A, 9B, 10, and 11 are cross-sectional views of the display device in FIG. 5A, taken along lines B-B' and C-C'. In FIGS. 9A, 9B, 10, and 11, the same reference symbols as those of FIG. 6 denote the same, and redundant descriptions thereof will be omitted.

Referring to FIGS. 9A, 9B, 10, and 11, the display device includes a substrate 100, a pixel circuit layer 210, a display element layer 220, an encapsulation layer 300, a light-shielding layer LBL, a functional layer 400, and a cover window 20.

The substrate 100 may include a first display area DA1 and a second display area DA2.

The display element layer 220 may include a first organic light-emitting diode OLED1, a second organic light-emitting diode OLED2, and a pixel-defining layer 225. The first organic light-emitting diode OLED1 is arranged on the substrate 100 and may include a first electrode 221A overlapping the first display area DA1. The second organic light-emitting diode OLED2 is arranged on the substrate 100 and may include a second electrode 221B overlapping the second display area DA2. The pixel-defining layer 225 may cover edges of the first electrode 221A, and a first opening OP1 exposing a central portion of the first electrode 221A may be defined in the pixel-defining layer 225. The pixel-defining layer 225 may cover edges of the second electrode 221B, and a second opening OP2 exposing a central portion of the second electrode 221B may be defined in the pixel-defining layer 225.

The first organic light-emitting diode OLED1 may implement a first red sub-pixel Pr1 in the first display area DA1. A width OPw1 of the first opening OP1 may correspond to a width w1 of the first red sub-pixel Pr1. The second organic light-emitting diode OLED2 may implement a second red sub-pixel Pr2 in the second display area DA2. A width OPw2 of the second opening OP2 may be a width w2 of the second red sub-pixel Pr2.

The encapsulation layer 300 may be arranged on the display element layer 220. The encapsulation layer 300 may cover the first organic light-emitting diode OLED1 and the second organic light-emitting diode OLED2. In an embodiment, the encapsulation layer 300 may include at least one inorganic encapsulation layer and at least one organic encapsulation layer. FIGS. 9A, 9B, 10 and 11 show that the encapsulation layer 300 includes a first inorganic encapsulation layer 310, a first organic encapsulation layer 320, and a second inorganic encapsulation layer 330 that are sequentially stacked.

The functional layer 400 may be arranged on the encapsulation layer 300. The functional layer 400 may be arranged on the second inorganic encapsulation layer 330. The functional layer 400 may include a touch conductive layer 401, a refractive layer 403, a high refractive layer 405, an inorganic layer 407, and an upper planarization layer 409.

The touch conductive layer 401 may be arranged on the encapsulation layer 300. The touch conductive layer 401 may include sensing electrodes for sensing a touch input. The touch conductive layer 401 may include a metal layer and/or a transparent conductive layer. In an embodiment, the metal layer may include Mo, Ag, Ti, Cu, Al, and any alloys thereof. In an embodiment, the transparent conductive layer may include a transparent conductive oxide, such as ITO, IZO, ZnO, indium tin zinc oxide ("ITZO"), or the like. In an embodiment, the transparent conductive layer may include a conductive polymer such as poly(3,4-ethylenedioxythiophene) ("PEDOT"), metal nanowires, carbon nanotubes, graphene, and the like. In some embodiments, the touch conductive layer 401 may be omitted.

In an embodiment, the light-shielding layer LBL may be arranged on the touch conductive layer 401. In an embodiment, the light-shielding layer LBL may cover the touch conductive layer 401, and the light-shielding layer LBL may overlap the touch conductive layer 401, for example.

A first hole H1 overlapping the first opening OP1 and a second hole H2 overlapping the second opening OP2 may be defined in the light-shielding layer LBL. The first hole H1 may overlap the first red sub-pixel Pr1, and the second hole H2 may overlap the second red sub-pixel Pr2.

A ratio of a width Hw1 of the first hole H1 to the width OPw1 of the first opening OP1 may be greater than a ratio of a width Hw2 of the second hole H2 to the width OPw2 of the second opening OP2. A ratio of the width Hw1 of the first hole H1 to the width w1 of the first red sub-pixel Pr1 may be greater than a ratio of the width Hw2 of the second hole H2 to the width w2 of the second red sub-pixel Pr2.

The refractive layer 403 may be arranged on the light-shielding layer LBL. A first refractive layer hole 403H1 and a second refractive layer hole 403H2 may be defined in the refractive layer 403. Each of the first refractive layer hole 403H1 and the second refractive layer hole 403H2 may penetrate through the refractive layer 403. The first refractive layer hole 403H1 may overlap the first display area DA1. The first refractive layer hole 403H1 may overlap the first hole H1. The second refractive layer hole 403H2 may overlap the second display area DA2. The second refractive layer hole 403H2 may overlap the second hole H2. In some embodiments, a first groove overlapping the first hole H1 and a second groove overlapping the second hole H2 may be defined in the refractive layer 403. In other words, the refractive layer 403 may not be penetrated.

In an embodiment, a size of the first refractive layer hole 403H1 may be less than a size of the first hole H1. The size of the first refractive layer hole 403H1 may be an area occupied by the first refractive layer hole 403H1. A width 403Hw1 of the first refractive layer hole 403H1 may be less than the width Hw1 of the first hole H1. The width 403Hw1 of the first refractive layer hole 403H1 may be a shortest distance between the refractive layers 403 defining the first refractive layer hole 403H1. Thus, the refractive layer 403 may cover the light-shielding layer LBL.

In an embodiment, a size of the second refractive layer hole 403H2 may be less than or equal to a size of the second hole H2. The size of the second refractive layer hole 403H2 may be an area occupied by the second refractive layer hole 403H2. A width 403Hw2 of the second refractive layer hole 403H2 may be less than or equal to the width Hw2 of the second hole H2. The width 403Hw2 of the second refractive layer hole 403H2 may be a shortest distance between the refractive layers 403 defining the second refractive layer hole 403H2.

The refractive layer 403 may include a photoresist. In this case, the refractive layer 403 may be formed by entirely applying the photoresist, and then exposing and developing the photoresist.

In an embodiment, the refractive layer 403 may include an acryl-based resin (e.g., PMMA, polyacrylic acid, etc.), ethyl hexyl acrylate, pentafluoropropyl acrylate, polyethylene glycol dimethacrylate, or ethylene glycol dimethacrylate. In some embodiments, the refractive layer 403 may further include a thermal curing agent such as epoxy, and/or a photocuring agent.

The high refractive layer 405 may be arranged on the refractive layer 403. An upper surface of the high refractive layer 405 may be flat. The high refractive layer 405 may fill the first refractive layer hole 403H1 and the second refractive layer hole 403H2. The high refractive layer 405 may have a refractive index greater than a refractive index of the refractive layer 403. In an embodiment, the refractive layer 403 may be a layer having a relatively low refractive index, and the high refractive layer 405 may be a layer having a relatively high refractive index. In an embodiment, the refractive index of the refractive layer 403 may be about 1.3 to about 1.65, for example. In an embodiment, the refractive index of the high refractive layer 405 may be about 1.6 to about 1.9.

The high refractive layer 405 may include an acryl-based or siloxane-based organic material. In some embodiments, the high refractive layer 405 may include polydiaryl siloxane, methyltrimethoxysilane, or tetramethoxysilane. In an embodiment, the high refractive layer 405 may be formed by applying an organic material through an inkjet printing process and curing the organic material. In another embodiment, the high refractive layer 405 may be formed through an evaporation process.

In an embodiment, metal oxide particles such as ZnO, $TiO_2$, zirconium dioxide ($ZrO_2$), and barium titanate ($BaTiO_3$) may be dispersed in the high refractive layer 405. In an embodiment, the high refractive layer 405 may be formed by applying an organic material including metal oxide particles by inkjet. Thus, the refractive index of the high refractive layer 405 may be greater than the refractive index of the refractive layer 403.

The refractive layer 403 and the high refractive layer 405 may cause light travelling in a direction crossing the third direction (e.g., the z direction or the −z direction), from among light emitted from the first organic light-emitting diode OLED1 and the second organic light-emitting diode OLED2, substantially propagate in the third direction (e.g., the z direction or the −z direction). Thus, the refractive layer 403 and the high refractive layer 405 may extract light that is extinct due to photorefraction, and the refractive layer 403 and the high refractive layer 405 may concentrate light.

The inorganic layer 407 may be arranged on the high refractive layer 405. In an embodiment, the inorganic layer 407 may include an inorganic insulating material, such as $SiO_2$, $SiN_x$, SiON, $Al_2O_3$, $TiO_2$, $Ta_2O_5$, $HfO_2$, or ZnO. When an upper light-shielding layer ULBL is formed on the inorganic layer 407, the inorganic layer 407 may prevent or reduce damage of the high refractive layer 405 arranged under the inorganic layer 407.

Referring to FIGS. 9A, 9B, and 10, the upper light-shielding layer ULBL may be arranged on the inorganic layer 407. The upper light-shielding layer ULBL may be arranged on the high refractive layer 405. In other words, the inorganic layer 407 may be arranged between the high refractive layer 405 and the upper light-shielding layer ULBL.

The upper light-shielding layer ULBL may at least partially absorb external light or internal reflected light. The upper light-shielding layer ULBL may include a black pigment. The upper light-shielding layer ULBL may include a black matrix. The upper light-shielding layer ULBL may be arranged in the second display area DA2. In an embodiment, the upper light-shielding layer ULBL may not be arranged in the first display area DA1. The upper light-shielding layer ULBL may be spaced apart from the first display area DA1.

An upper hole UH may be defined in the upper light-shielding layer ULBL. The upper hole UH may penetrate through the upper light-shielding layer ULBL. The upper hole UH may overlap the second display area DA2.

The upper hole UH may overlap a second electrode 221B. The upper hole UH may overlap the second opening OP2. The upper hole UH may overlap the second red sub-pixel Pr2.

The upper light-shielding layer ULBL may be arranged farther away from the second organic light-emitting diode OLED2 than the light-shielding layer LBL is from the organic light-emitting diode OLED2. In an embodiment, a vertical distance d between a lower surface BLLS of the upper light-shielding layer ULBL facing the pixel-defining layer 225 and an upper surface of the second electrode 221B may be about 30 μm or more. The vertical distance d may be a distance between the lower surface BLLS of the upper light-shielding layer ULBL and the upper surface of the second electrode 221B in the third direction (e.g., the z direction or the −z direction). In an embodiment, when the vertical distance d is about 30 μm or more, the luminance change may be minimized when a viewing angle is about 0 degree)(° or more and about 5° or less. In addition, when a viewing angle is about 45 degrees or more, the luminance may decrease to about 10 percent (%) or less.

In this case, the upper light-shielding layer ULBL may reduce propagation of light emitted from the second organic light-emitting diode OLED2 in a direction crossing the third direction (e.g., the z direction or the −z direction). Thus, light traveling in a direction crossing the third direction (e.g., the z direction or the −z direction) from the second organic light-emitting diode OLED2 may be at least partially removed. The light emitted from the second organic light-emitting diode OLED2 may reach a user of the display device, but may not reach other people around the user. In other words, the display device may provide a narrow viewing angle in the second display area DA2.

Referring to FIG. 9A, a size of the upper hole UH may be greater than a size of the second hole H2. A width UHw of the upper hole UH may be greater than the width Hw2 of the second hole H2. Thus, a difference in reflectance between the display device in the first display area DA1 and the display device in the second display area DA2 may be reduced.

In an embodiment, a ratio of the size of the first hole H1 to the size of the first red sub-pixel Pr1 may be the same as a ratio of the size of the upper hole UH to the size of the second red sub-pixel Pr2. In an embodiment, a ratio of the width Hw1 of the first hole H1 to the width w1 of the first red sub-pixel Pr1 may be the same as a ratio of the width UHw of the upper hole UH to the width w2 of the second red sub-pixel Pr2.

In an embodiment, a ratio of the size of the first hole H1 to the size of the first opening OP1 may be the same as a ratio of the size of the upper hole UH to the size of the second opening OP2. In an embodiment, a ratio of the width Hw1 of the first hole H1 to the width OPw1 of the first opening OP1 may be the same as a ratio of the width UHw of the upper hole UH to the width OPw2 of the second opening OP2.

Referring to FIG. 9B, the size of the upper hole UH may be less than or equal to the size of the second hole H2. The width UHw of the upper hole UH may be less than or equal to the width Hw2 of the second hole H2. In this case, the display device may provide a narrower viewing angle in the second display area DA2.

Referring to FIGS. 9A and 9B, the upper planarization layer 409 may be arranged on the upper light-shielding layer ULBL. In an embodiment, the upper planarization layer 409 may fill the upper hole UH of the upper light-shielding layer ULBL. An upper surface of the upper planarization layer 409 may be substantially flat and may include an organic material, such as acryl, BCB, or HMDSO.

A polarizing layer POL may be arranged on the upper light-shielding layer ULBL. The polarizing layer POL may reduce the reflectance of light incident from the outside. In an embodiment, the polarizing layer POL may include a polarization film. In an embodiment, the polarizing layer POL may include a linear planarization plate and a phase delay film such as a quarter-wave (λ/4) plate. The phase delay film may be arranged on the functional layer 400, and the linear planarization plate may be arranged on the phase delay film.

The cover window 20 may be arranged on the polarizing layer POL.

Referring to FIG. 10, a plurality of color filters CF may be arranged on the high refractive layer 405. The plurality of color filters CF may reduce the reflectance of light incident from the outside. In an embodiment, the plurality of color filters CF may be arranged on the inorganic layer 407.

The plurality of color filters CF may overlap the first display area DA1 and the second display area DA2. The plurality of color filters CF may overlap the first hole H1 and the second hole H2, respectively.

One of the plurality of color filters CF may overlap the second hole H2. The color filter CF overlapping the second hole H2 may fill the upper hole UH.

The upper planarization layer 409 may be arranged on the plurality of color filters CF. The upper surface of the upper planarization layer 409 may be substantially flat and may include an organic material, such as acryl, BCB, or HMDSO.

The cover window 20 may be arranged on the upper planarization layer 409.

Referring to FIG. 11, the plurality of color filters CF may be arranged on the inorganic layer 407. The plurality of color filters CF may reduce the reflectance of light incident from the outside. In an embodiment, the plurality of color filters CF may include a first color filter CF1, a second color filter CF2, and a third color filter CF3. The first color filter CF1, the second color filter CF2, and the third color filter CF3 may transmit light of different colors from one another. In an embodiment, the first color filter CF1 may transmit red light, for example. The second color filter CF2 may transmit green light. The third color filter CF3 may transmit blue light.

The plurality of color filters CF may overlap the first display area DA1 and the second display area DA2. The plurality of color filters CF may overlap the first hole H1 and the second hole H2, respectively.

One of the plurality of color filters CF may overlap the second hole H2. In an embodiment, the first color filter CF1 may overlap the first hole H1 and the second hole H2, for example.

A light-shielding portion LBP may be defined by overlapping the first color filter CF1, the second color filter CF2, and the third color filter CF3 that transmit light of different colors from one another. Thus, the light-shielding portion LBP may at least partially absorb external light or internal reflected light. In this case, a process of forming an upper light-shielding layer may be omitted.

The light-shielding portion LBP may be arranged in the second display area DA2. In an embodiment, the light-shielding portion LBP may not be arranged in the first display area DA1. The light-shielding portion LBP may be spaced apart from the first display area DA1.

A light-shielding portion hole BPH may be defined in the light-shielding portion LBP. The light-shielding portion hole BPH may be defined between light-shielding portions LBP that are adjacent to each other. In an embodiment, the light-shielding portion hole BPH may be defined by a side surface of the second color filter CF2 and a side surface of the third color filter CF3 facing each other, for example. The light-shielding portion hole BPH may overlap the second display area DA2. In this case, the light-shielding portion hole BPH and the first color filter CF1 may overlap each other. The first color filter CF1 may fill the light-shielding portion hole BPH.

The light-shielding portion hole BPH may overlap the second electrode 221B. The light-shielding portion hole BPH may overlap the second opening OP2. The light-shielding portion hole BPH may overlap the second red sub-pixel Pr2.

The light-shielding portion LBP may be arranged farther away from the second organic light-emitting diode OLED2 than the light-shielding layer LBL is from the organic light-emitting diode OLED2. In an embodiment, a vertical distance d−1 between a lower surface LBPLS of the light-shielding portion LBP facing the pixel-defining layer 225 and the upper surface of the second electrode 221B may be about 30 μm or more. The vertical distance d−1 may be a distance between the lower surface LBPLS of the light-shielding portion LBP and the upper surface of the second electrode 221B in the third direction (e.g., the z direction or the −z direction). When the vertical distance d−1 is about 30 μm or more, the luminance change may be minimized when a viewing angle is about 0° or more and about 5° or less. In addition, when a viewing angle is about 45 degrees or more, the luminance may be reduced to about 10% or less.

In this case, the light-shielding portion LBP may reduce propagation of light emitted from the second organic light-emitting diode OLED2 in a direction crossing a third direction (e.g., a z direction or a −z direction). Thus, light traveling in a direction crossing the third direction (e.g., the z direction or the −z direction) from the second organic light-emitting diode OLED2 may be at least partially removed. The light emitted from the second organic light-emitting diode OLED2 may reach a user of the display device, but may not reach other people around the user. In other words, the display device may provide a narrow viewing angle in the second display area DA2.

In an embodiment, a size of the light-shielding portion hole BPH may be greater than a size of a second hole H2. A width BPHw of the light-shielding portion hole BPH may be greater than a width Hw2 of the second hole H2. Thus, a difference in reflectance between the display device in the first display area DA1 and the display device in the second display area DA2 may be reduced.

In an embodiment, a ratio of the size of the first hole H1 to a size of a first red sub-pixel Pr1 may be the same as a ratio of the size of the light-shielding portion hole BPH to the size of a second red sub-pixel Pr2. In an embodiment, a ratio of a width Hw1 of the first hole H1 to a width w1 of the first red sub-pixel Pr1 may be the same as a ratio of the width BPHw of the light-shielding portion hole BPH to the width w2 of the second red sub-pixel Pr2.

In an embodiment, a ratio of the size of the first hole H1 to the size of a first opening OP1 may be the same as a ratio of the size of the light-shielding portion hole BPH to a size of a second opening OP2. In an embodiment, a ratio of the width Hw1 of the first hole H1 to a width OPw1 of the first opening OP1 may be the same as a ratio of the width BPHw of the light-shielding portion hole BPH to a width OPw2 of the second opening OP2.

In another embodiment, the size of the light-shielding portion hole BPH may be less than or equal to the size of the second hole H2. The width BPHw of the light-shielding portion hole BPH may be less than or equal to the width Hw2 of the second hole H2.

The upper planarization layer 409 may be arranged on the plurality of color filters CF. The upper surface of the upper planarization layer 409 may be substantially flat and may include an organic material, such as acryl, BCB, or HMDSO.

The cover window 20 may be arranged on the upper planarization layer 409.

Figure 12A:
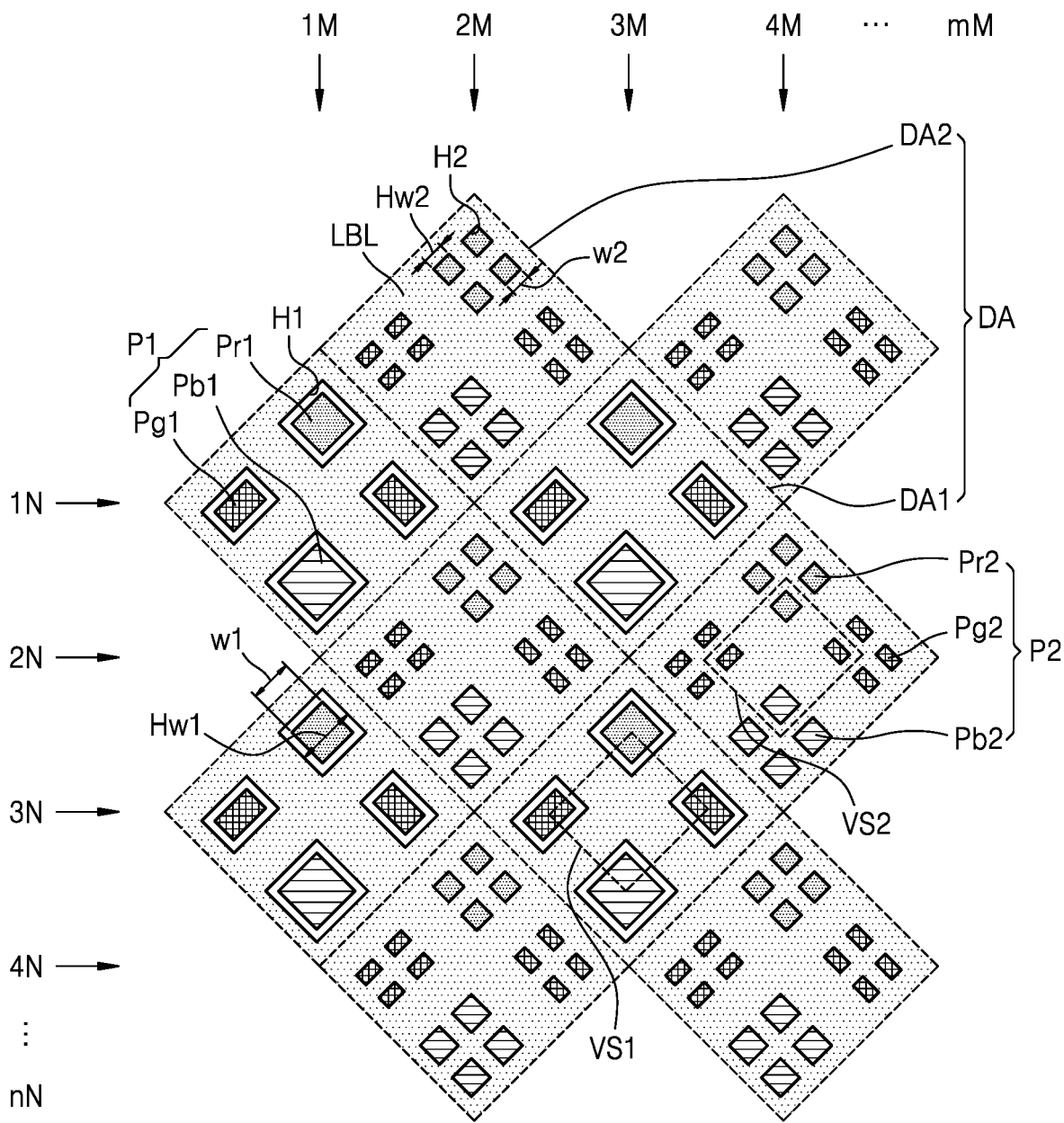
FIGS. 12A and 12B are plan views illustrating an embodiment of a display method of a display device.
Figure 12B:
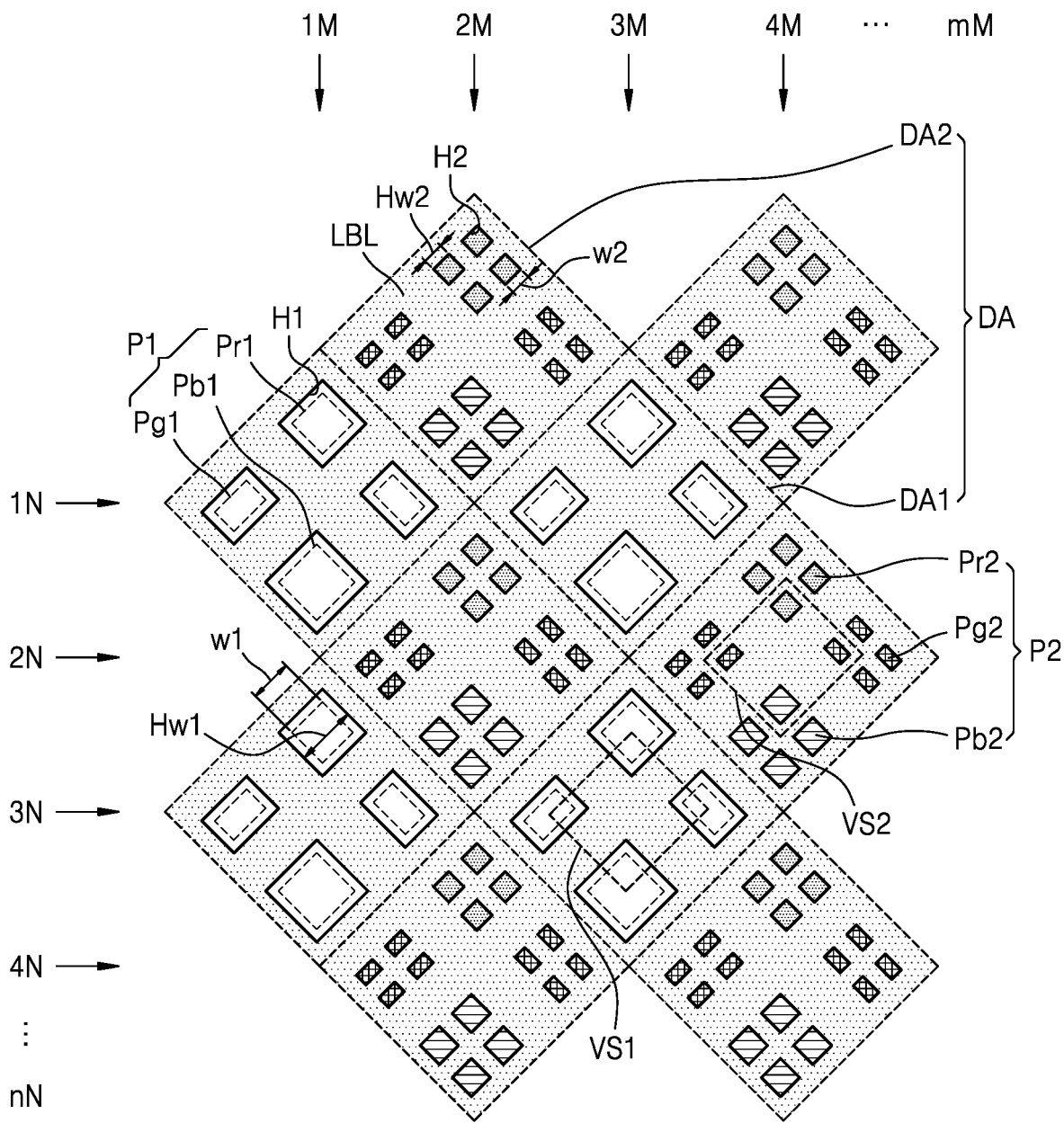

FIGS. 12A and 12B are plan views illustrating an embodiment of a display method of a display device. In FIGS. 12A to 12B, the same reference symbols as those of FIG. 5A denote the same, and redundant descriptions thereof will be omitted.

Referring to FIG. 12A, a first sub-pixel P1 arranged in a first display area DA1 and a second sub-pixel P2 arranged in a second display area DA2 may each emit light to display an image. In an embodiment, in a first mode in which a wide viewing angle is provided, the first sub-pixel P1 arranged in the first display area DA1 may emit light. In addition, in the first mode, the second sub-pixel P2 arranged in the second display area DA2 may emit light.

Referring to FIG. 12B, in a second mode in which a narrow viewing angle is provided, the second sub-pixel P2 arranged in the second display area DA2 may emit light. In this case, the first sub-pixel P1 arranged in the first display area DA1 may not emit light. Accordingly, a user may not expose an image displayed on the display device to others around the user.

In an embodiment, a plurality of first display areas DA1 and a plurality of second display areas DA2 may be provided. Each of the plurality of first display areas DA1 and the plurality of second display areas DA2 may be arranged in a first direction (e.g., an x direction or a −x direction) and a second direction (e.g., a y direction or a −y direction). Any one of the plurality of second display areas DA2 may be surrounded by the plurality of first display areas DA1. Thus, in the first mode and the second mode, the display device may provide a uniform resolution.

As described above, the display device in an embodiment may include a light-shielding layer having a first hole overlapping a first sub-pixel and a second hole overlapping a second sub-pixel. Thus, it is possible to prevent or reduce the sharing of information provided by the display device with others.

In addition, in the display device in the embodiment, a ratio of a width of the first hole to a width of the first sub-pixel may be greater than a ratio of a width of the second hole to a width of the second sub-pixel. Therefore, a difference in reflectance between the first display area and the second display area may be reduced.

It should be understood that the embodiments described herein should be considered in a descriptive sense only and not for purposes of limitation. Descriptions of features or embodiments within each of the embodiments should typically be considered as available for other similar features or embodiments in other embodiments. While one or more embodiments have been described with reference to the drawing figures, it will be understood by one of ordinary skill in the art that various changes in form and details may be made therein without departing from the spirit and scope of the invention.

What is claimed is:

1. A display device comprising:
   a substrate comprising a first display area and a second display area;
   a first sub-pixel in the first display area;
   a second sub-pixel in the second display area;
   a first light-shielding layer in which a first hole and a second hole are defined; and
   a second light-shielding layer which overlaps the second display area and is over the first light-shielding layer and in which a third hole is defined, the second light-shielding layer being farther from the substrate than the first light-shielding layer,
   wherein the first hole overlaps the first sub-pixel, the second hole overlaps the second sub-pixel, and the third hole overlaps the second hole, and
   wherein a width of the third hole is greater than a width of the second hole.

2. The display device of claim 1, wherein a width of the first sub-pixel is less than a width of the first hole.

3. The display device of claim 1, wherein a width of the second sub-pixel is equal to the width of the second hole.

4. The display device of claim 1, wherein a plurality of first display areas and a plurality of second display areas are provided,
   the plurality of first display areas and the plurality of second display areas are arranged in a first direction and a second direction crossing the first direction, respectively, and
   any one of the plurality of second display areas is surrounded by the plurality of first display areas.

5. The display device of claim 1, wherein a plurality of first sub-pixels is provided in the first display area, and the first hole overlaps the plurality of first sub-pixels.

6. The display device of claim 1, further comprising:
   a refractive layer which is arranged on the first light-shielding layer and in which a first refractive layer hole and a second refractive layer hole respectively overlapping the first hole and the second hole are defined; and
   a high refractive layer arranged on the refractive layer and filling the first refractive layer hole and the second refractive layer hole,
   wherein the second light-shielding layer is arranged on the high refractive layer, and
   a refractive index of the high refractive layer is greater than a refractive index of the refractive layer.

7. The display device of claim 6, further comprising a plurality of color filters arranged on the high refractive layer and overlapping the first hole and the second hole,
   wherein one of the plurality of color filters overlaps the second hole and fills the third hole.

8. The display device of claim 1, further comprising a polarizing layer on the second light-shielding layer.

9. The display device of claim 1, wherein a ratio of a width of the first hole to a width of the first sub-pixel is equal to a ratio of the width of the third hole to a width of the second sub-pixel.

10. The display device of claim 1, further comprising:
    a first display element implementing the first sub-pixel;
    a second display element implementing the second sub-pixel; and
    an encapsulation layer arranged on the first and second display elements and comprising at least one inorganic encapsulation layer and at least one organic encapsulation layer,
    wherein the first light-shielding layer is arranged on the at least one inorganic encapsulation layer.

11. A display device comprising:
    a substrate comprising a first display area and a second display area;
    a display element layer comprising:
      a first display element comprising a first electrode overlapping the first display area;
      a second display element comprising a second electrode overlapping the second display area; and
      a pixel-defining layer which covers an edge of the first electrode and an edge of the second electrode, and in which a first opening exposing a central portion of the first electrode and a second opening exposing a central portion of the second electrode are defined;
    a first light-shielding layer which is arranged on the display element layer and in which a first hole overlapping the first opening and a second hole overlapping the second opening are defined; and
    a second light-shielding layer which overlaps the second display area and is over the first light-shielding layer and in which a third hole overlapping the second hole is defined, the second light-shielding layer being farther from the second display element than the first light-shielding layer,
    wherein a width of the third hole is greater than a width of the second hole.

12. The display device of claim 11, wherein a width of the first opening is less than a width of the first hole.

13. The display device of claim 11, wherein a width of the second opening is equal to the width of the second hole.

14. The display device of claim 11, wherein a ratio of a width of the first hole to a width of the first opening is equal to a ratio of the width of the third hole to a width of the second opening.

15. The display device of claim 11, further comprising:
    a refractive layer which is arranged on the first light-shielding layer and in which a first refractive layer hole and a second refractive layer hole respectively overlapping the first hole and the second hole are defined; and
    a high refractive layer arranged on the refractive layer and filling the first refractive layer hole and the second refractive layer hole,
    wherein the second light-shielding layer is arranged on the high refractive layer, and
    a refractive index of the high refractive layer is greater than a refractive index of the refractive layer.

16. The display device of claim 15, further comprising a plurality of color filters arranged on the high refractive layer and overlapping the first hole and the second hole,
    wherein one of the plurality of color filters overlaps the second hole and fills the third hole.

17. The display device of claim 15, further comprising an inorganic layer between the high refractive layer and the second light-shielding layer.

18. The display device of claim 11, further comprising a polarizing layer on the second light-shielding layer.

19. The display device of claim 11, wherein a vertical distance from a surface of the second electrode facing the second light-shielding layer to a surface of the second light-shielding layer facing the second electrode is about 30 micrometers or more.

\* \* \* \* \*